US009299290B2

(12) United States Patent
Ono

(10) Patent No.: US 9,299,290 B2
(45) Date of Patent: Mar. 29, 2016

(54) DISPLAY DEVICE AND CONTROL METHOD THEREOF

(75) Inventor: Shinya Ono, Osaka (JP)

(73) Assignee: JOLED INC., Tokyo (JP)

( * ) Notice: Subject to any disclaimer, the term of this patent is extended or adjusted under 35 U.S.C. 154(b) by 63 days.

(21) Appl. No.: 14/359,940

(22) PCT Filed: Nov. 24, 2011

(86) PCT No.: PCT/JP2011/006544
§ 371 (c)(1),
(2), (4) Date: May 22, 2014

(87) PCT Pub. No.: WO2013/076773
PCT Pub. Date: May 30, 2013

(65) Prior Publication Data
US 2014/0313109 A1 Oct. 23, 2014

(51) Int. Cl.
G09G 3/30 (2006.01)
G09G 3/32 (2006.01)
H01L 27/32 (2006.01)

(52) U.S. Cl.
CPC ............ *G09G 3/3258* (2013.01); *G09G 3/3233* (2013.01); *H01L 27/3244* (2013.01); *G09G 2300/0819* (2013.01); *G09G 2300/0852* (2013.01); *G09G 2300/0861* (2013.01); *G09G 2320/0223* (2013.01)

(58) Field of Classification Search
CPC ......... G09G 3/3258; G09G 3/20; G09G 3/30; H01L 27/3244
See application file for complete search history.

(56) References Cited

U.S. PATENT DOCUMENTS 7,329,849 B2 2/2008 Kasai
7,564,433 B2 7/2009 Hector et al.
7,639,211 B2 12/2009 Miyazawa
7,663,615 B2 2/2010 Shirasaki et al.
7,944,416 B2 5/2011 Ono et al.
8,144,081 B2 3/2012 Miyazawa
(Continued)

FOREIGN PATENT DOCUMENTS

CN 101800026 8/2010
JP 2006-177988 7/2006
(Continued)

OTHER PUBLICATIONS

Search report from PCT/JP2011/006544, mail date is Mar. 6, 2012.
(Continued)

*Primary Examiner* — Towfiq Elahi
(74) *Attorney, Agent, or Firm* — Greenblum & Bernstein, P.L.C.

(57) ABSTRACT

Plural pixel circuits of a display device each include: a drive transistor having drain or source connected to a first power source voltage; a first capacitive element having a first electrode connected to a gate of the drive transistor and a second electrode connected to the source of the drive transistor; a second capacitive element having a first electrode connected to the second electrode of the first capacitive element and a second electrode directly connected to a data line that transmits a voltage corresponding to a light-emitting luminance; a first switching element that switches between conduction and non-conduction between the gate of the drive transistor and a fixed reference voltage; and a light-emitting device having a first electrode connected to source or drain of the drive transistor and a second electrode connected to a second power source voltage.

7 Claims, 16 Drawing Sheets

(56) References Cited

U.S. PATENT DOCUMENTS

| | | |
|---|---|---|
| 8,432,338 B2 | 4/2013 | Ono |
| 8,581,485 B2 | 11/2013 | Ono et al. |
| 2006/0077134 A1 | 4/2006 | Hector et al. |
| 2006/0125740 A1 | 6/2006 | Shirasaki et al. |
| 2006/0231740 A1 | 10/2006 | Kasai |
| 2007/0018078 A1 | 1/2007 | Miyazawa |
| 2007/0040104 A1 | 2/2007 | Miyazawa |
| 2007/0046592 A1 | 3/2007 | Ono et al. |
| 2010/0007645 A1* | 1/2010 | Ono ............................. 345/211 |
| 2010/0201674 A1 | 8/2010 | Kim et al. |
| 2010/0253609 A1 | 10/2010 | Ono et al. |
| 2011/0157135 A1 | 6/2011 | Lee et al. |
| 2013/0300724 A1* | 11/2013 | Chaji ............................. 345/212 |

FOREIGN PATENT DOCUMENTS

| | | |
|---|---|---|
| JP | 2006-516745 | 7/2006 |
| JP | 2006-301159 | 11/2006 |
| JP | 2007-065539 | 3/2007 |
| JP | 2009-134110 | 6/2009 |
| JP | 2010-160508 | 7/2010 |
| WO | 2004/066249 | 8/2004 |
| WO | 2008/152817 | 12/2008 |

OTHER PUBLICATIONS

Office Action from The Patent Office of the People's Republic of China in Chinese Patent Application No. 201180075030.3, dated Sep. 1, 2015, along with an English language translation thereof.

* cited by examiner

DISPLAY DEVICE AND CONTROL METHOD THEREOF

TECHNICAL FIELD

The present invention relates to a display device and a method of controlling the display device.

BACKGROUND ART

Recent years have seen progress in the development and practical implementation of display devices (hereafter referred to as organic EL display devices) using organic EL elements. Generally, an organic EL display device includes (i) a display unit having, arranged in a matrix, plural pixel circuits each having an organic EL element, and (ii) a drive circuit for driving the display unit.

The active-matrix organic EL display devices which have been put into practical implementation have a structure (cathode common structure) in which cathode electrodes of organic EL elements of respective pixels have a common potential. Furthermore, drive circuits for controlling the light emission of these organic EL elements are generally configured of P-type thin film transistors (TFT).

On the other hand, a high performance TFT has been explored in an attempt to enhance performance of an amorphous silicon TFT which is easy to manufacture. For example, an oxide TFT which uses the oxide as the semiconductor layer is almost ready for practical use and is gathering attention. The characteristics of the oxide TFT have been realized only for the N-type TFT, which is reported to have mobility of 10 times or more than the amorphous silicon transistor.

In such a situation, what is important in providing high-performance display devices while saving the manufacturing costs is a pixel circuit of N-type transistor that supports the cathode common organic EL element which is technically established and causes the organic EL element to emit light at a more accurate and stable luminance. Thus, various circuit structures and control methods have been proposed (see Patent Literature (PTL) 1, for example).

FIG. 20 is a circuit diagram showing a conventional pixel circuit 90 disclosed in PTL 1. The pixel circuit 90 includes a drive transistor TD, a switching transistor T9, a capacitor Cs, and an organic EL element EL. The pixel circuit 90 includes two transistors and one capacitor only, and is able to cause the organic EL element to emit light at an accurate and stable luminance.

The pixel circuit 90 is supplied with a control signal from a scanning line drive circuit 4 via a signal line SCAN, and supplied with a data voltage corresponding to a light-emitting luminance from a signal line drive circuit 5 via a data line DATA. Furthermore, a power source voltage for use in the light emission by the organic EL element EL is supplied to the pixel circuit 90 from a power source circuit not shown in the Drawing via power source lines VDD and VSS.

FIG. 21 is a timing chart showing an example of the control signal, data voltage, and power source voltage for operating the pixel circuit 90, for one-frame period. In FIG. 21, the vertical axis denotes the level of each signal, and the horizontal axis represents the passing of time. To facilitate description, the control signal, the data voltage, and the power source voltage are given the same names as the respective signal lines and power source lines through which they are transmitted.

The pixel circuit 90 repeats a Vth detecting step, a data writing step, a resetting step, and a light-emitting step, on a frame basis, according to the control signal, power source voltage, and data signal shown in FIG. 21.

In FIG. 22, (a) to (d) are circuit diagrams for describing the operation on the pixel circuit 90 in the Vth detecting step, the data writing step, the resetting step, and the light-emitting step, respectively.

The operation on the pixel circuit 90 performed according to the control signal, data voltage, and power source voltage shown in FIG. 21 is described with reference to (a) to (d) in FIG. 22.

As shown in (a) in FIG. 22, in the Vth detecting step, the power source voltage VDD is set to 0, the power source voltage VSS is set to $V_{E2}$, and the data voltage DATA is set to $V_{DH}$. There is a conducting state between the switching transistor T9 and the drive transistor TD, and the voltage of the gate electrode of the drive transistor TD is converged to the voltage Vth which is a voltage increased from the power source voltage VDD by the threshold voltage Vth of the drive transistor TD. The threshold voltage Vth is held by the capacitor Cs based on the voltage $V_{DH}$ obtained from the data line DATA.

As shown in (b) in FIG. 22, in the data writing step, the data voltage DATA is set to a voltage dropped from $V_{DH}$ by ΔVdata that is an amount corresponding to the light-emitting luminance. Since the switching transistor T9 is in the conducting state, the drop amount ΔVdata of the data voltage DATA is distributed to the capacitor Cs and the parasitic capacitance Cel of the organic EL element according to the ratio between the capacitance of the capacitor Cs and the parasitic capacitance Cel of the organic EL element EL: Cel/(Cel+Cs)=α. As a result, the voltage of the gate electrode of the drive transistor TD becomes −αΔVdata+Vth.

As shown in (c) in FIG. 22, in the resetting step, the switching transistor T9 is switched to the non-conducting state (represented with dashed line). Furthermore, the power source voltage VDD is set to $-V_{E1}$, and the data voltage DATA is set to $V_{DH}$ again. Since the switching transistor T9 is in the non-conducting state, the increase amount ΔVdata of the data voltage DATA is all added to the voltage of the gate electrode of the drive transistor TD. As a result, the voltage of the gate electrode of the drive transistor TD becomes (−αΔVdata+Vth)+ΔVdata=(1−α)ΔVdata+Vth.

The drive transistor TD is turned into ON state by the differential voltage between the voltage of the gate electrode and the power source voltage VDD, and the anode voltage of the organic EL element EL is initialized to $-V_{E1}$.

As shown in (d) in FIG. 22, in the light-emitting step, the power source voltage VSS is set to $-V_{EE}$, and the voltage of the source electrode of the drive transistor TD becomes a voltage $V_{EE}+V_{EL}$ obtained by adding the power source voltage VSS and the ON voltage of the organic EL element EL. The voltage which is $(1-\alpha)\Delta Vdata+Vth-(V_{EE}+V_{EL})$ is applied between the gate electrode and the source electrode of the drive transistor TD.

As a result, a current $i_{pix}=\beta/2((1-\alpha)\Delta Vdata-(V_{EE}+V_{EL}))^2$, which does not include the term representing the threshold voltage Vth of the drive transistor TD, is supplied from the drive transistor TD to the organic EL element EL. Thus, the organic EL element EL emits light at the luminance corresponding to the magnitude of the current $i_{pix}$.

As described above, the pixel circuit 90 reduces the effect of the threshold voltage Vth considerably by the Vth detection operation, and makes it possible for the organic EL element EL to emit light at a more accurate and stable luminance.

CITATION LIST

Patent Literature

[PTL 1] Japanese Unexamined Patent Application Publication No. 2010/160508

SUMMARY OF INVENTION

Technical Problem

As described above, in spite of its simple structure configured of two N-type transistors and one capacitance, the conventional pixel circuit 90 excludes, by adeptly using the reverse bias characteristics of the cathode-common organic EL element, the term of threshold voltage Vth of the drive transistor TD from the magnitude of the current $i_{pix}$ that is to be supplied from the drive transistor TD to the organic EL element EL. This allows the organic EL element EL to emit light at a luminance not affected by the change in the threshold voltage Vth of the drive transistor TD.

However, the pixel circuit 90 has at least three error causes remained which lower the accuracy of the light-emitting luminance of the organic EL element EL.

The first error cause is that the magnitude of the current $i_{pix}$ depends on the power source voltage VSS. If the power source voltage VSS is correctly set to $-V_{EE}$, the correct light-emitting luminance can be obtained. However, in the power source line VSS that transmits a large current for use in light emission by the organic EL element EL, a complicated voltage drop that varies according to the light-emitting luminance occurs due to the wiring resistance of the power source line VSS itself. Thus, it cannot be practically expected that the voltage of the connecting point of the power source line VSS and the pixel circuit 90 is correctly set to $-V_{EE}$ in the light-emission period. Errors in the power source voltage VSS are reflected to errors in the light-emitting luminance of the organic EL element EL.

The second error cause is that the magnitude of the current $i_{pix}$ depends on the drive voltage of the organic EL element EL. Generally, the current flowing in the organic EL element EL for light emission causes stress which deteriorates the organic EL element EL itself, lowers the light-emission efficiency due to aging, and varies its electrical characteristics. Generally, the drive voltage of the organic EL element EL required for flowing the same magnitude of current increases due to aging. Specifically, the deterioration in pixel luminance due to aging is caused not only by the deterioration in light-emission efficiency of the organic EL element EL but also by the increase in drive voltage. This makes the deterioration more visible.

The third error cause is that the magnitude of the current $i_{pix}$ depends on the ratio $\alpha$ between the capacitance of the capacitor Cs and the parasitic capacitance of the organic EL element EL. In general, the accuracy of the parasitic capacitance of the organic EL element EL is inferior to the accuracy of the capacitance of the capacitor formed intentionally. Thus, practically, the ratio $\alpha$ includes considerable degree of errors. Errors in the ratio $\alpha$ are reflected to errors in the light-emitting luminance of the organic EL element EL.

The present invention has been made to solve the above issues, and has an object to provide a display device including a pixel circuit capable of causing an organic EL element to emit light at a more accurate and stable luminance and the control method of the display device.

Solution to Problem

In order to achieve the above object, a display device according to an aspect of the present invention is a display device including a display unit having a plurality of pixel circuits each of which includes: a drive transistor having a drain electrode and a source electrode, one of the drain electrode and the source electrode being connected to a first power source line that transmits a first power source voltage; a first capacitive element having a first electrode connected to a gate electrode of the drive transistor and a second electrode connected to the source electrode of the drive transistor; a second capacitive element having a first electrode connected to the second electrode of the first capacitive element and a second electrode connected to a data line that transmits a data voltage corresponding to a luminance; a first switching element that switches between conduction and non-conduction between the gate electrode of the drive transistor and a reference voltage line that transmits a fixed reference voltage; and a light-emitting device having a first electrode connected to an other of the drain electrode and the source electrode of the drive transistor and a second electrode connected to a second power source line that transmits a second power source voltage, wherein, in a data voltage writing period, the first switching element is switched to a conducting state in a row-to-be-written and to a non-conducting state in a row other than the row-to-be-written.

Advantageous Effects of Invention

With the display device according to the present invention, the effect of the threshold voltage Vth is significantly reduced by performing the Vth detection operation and reset operation, in the same manner as in the conventional pixel circuit.

In addition, unlike the conventional pixel circuit, the data voltage held by the first capacitive element is applied between the gate electrode and the source electrode of the drive transistor, and thus the magnitude of the current supplied from the drive transistor to the light-emitting device is not affected by the power source voltage. In other words, the above-described first and second error causes are eliminated.

Furthermore, the data voltage held by the first capacitive element is determined according to the capacitance ratio between the first capacitive element and the second capacitive element. Thus, the data voltage can be set to the first capacitive element more accurately than in the conventional technique which uses the parasitic capacitance of the light-emitting device. In other words, the above-described third error cause is eliminated.

Accordingly, with the above-described pixel circuit, it is possible to cause the organic EL element EL to emit light at a more accurate and stable luminance than in the conventional technique.

DESCRIPTION OF EMBODIMENTS

Figure 1:
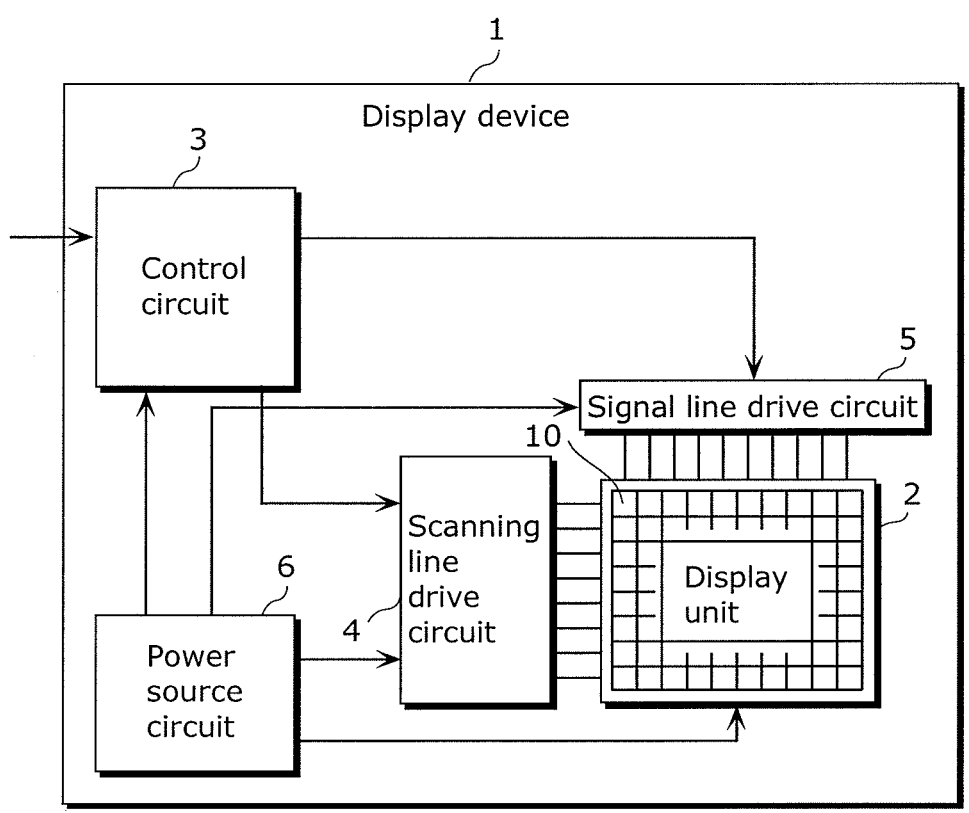
FIG. 1 is a function block diagram showing an example of a configuration of a display device according to Embodiment 1.

A display device according to an aspect of the present invention is a display device including a display unit having a plurality of pixel circuits each of which includes: a drive transistor having a drain electrode and a source electrode, one of the drain electrode and the source electrode being connected to a first power source line that transmits a first power source voltage; a first capacitive element having a first electrode connected to a gate electrode of the drive transistor and a second electrode connected to the source electrode of the drive transistor; a second capacitive element having a first electrode connected to the second electrode of the first capacitive element and a second electrode connected to a data line that transmits a data voltage corresponding to a luminance; a first switching element that switches between conduction and non-conduction between the gate electrode of the drive transistor and a reference voltage line that transmits a fixed reference voltage; and a light-emitting device having a first electrode connected to an other of the drain electrode and the source electrode of the drive transistor and a second electrode connected to a second power source line that transmits a second power source voltage.

Here, the second electrode of the second capacitive element may be directly connected to the data line.

With this configuration, the effect of the threshold voltage Vth is significantly reduced by performing Vth detection operation and reset operation, in the same manner as in the conventional pixel circuit.

In addition, unlike the conventional pixel circuit, the data voltage held by the first capacitance element is applied between the gate electrode and the source electrode of the drive transistor, and thus the magnitude of the current supplied from the drive transistor to the light-emitting device is not affected by the power source voltage.

Furthermore, the data voltage held by the first capacitive element is determined according to the capacitance ratio between the first capacitive element and the second capacitive element. Thus, the data voltage can be set to the first capacitive element more accurately than in the conventional technique which uses the parasitic capacitance of the light-emitting device.

Accordingly, with the pixel circuit, it is possible to cause the organic EL element EL to emit light at a more accurate and stable luminance than in the conventional technique.

Furthermore, each of the pixel circuits may further include a second switching element provided between the source electrode of the drive transistor and the second electrode of the first capacitive element.

With this configuration, the source electrode of the drive transistor and the second electrode of the first capacitive element can be electrically separated, which eliminates the concern on the change in the data voltage held by the first capacitive element along with the voltage change in the source electrode of the drive transistor. As a result, it is possible to cause the organic EL element EL to emit light with a more accurate and stable luminance.

Furthermore, each of the pixel circuits may further include a third switching element provided between the first power source line and the one of the drain electrode and the source electrode of the drive transistor.

With this configuration, the light-emission operation can be started all together for the pixel circuits of all of the rows using the third switching elements. This prevents the pixel current in the pixel circuit which started the light-emission operation earlier from being unstable during the writing operation on the pixel circuits of other rows. Thus, an excellent display image quality can be realized.

Furthermore, each of the pixel circuits may further include a fourth switching element provided between the data line and the second electrode of the second capacitive element.

With this configuration, by using the fourth switching element, the pixel circuit can be electrically separated from the data line at least in the light-emission period, which prevents the pixel current in the pixel circuit which started the light-emission operation earlier from being unstable during the writing operation on other rows. Thus, an excellent visual quality can be realized.

A control method according to an aspect of the present invention is a method of controlling a display device including a display unit having a plurality of pixel circuits each of which includes: a drive transistor having a drain electrode and a source electrode, one of the drain electrode and the source electrode being connected to a first power source line that transmits a first power source voltage; a first capacitive element having a first electrode connected to a gate electrode of the drive transistor and a second electrode connected to the source electrode of the drive transistor; a second capacitive element having a first electrode connected to the second electrode of the first capacitive element and a second electrode connected to a data line that transmits a data voltage corresponding to a luminance; a first switching element that switches between conduction and non-conduction between the gate electrode of the drive transistor and a reference voltage line that transmits a fixed reference voltage; and a light-emitting device having a first electrode connected to the other of the drain electrode and the source electrode of the drive transistor and a second electrode connected to a second power source line that transmits a second power source voltage, the method including: detecting a threshold voltage of the drive transistor by switching the first switching element conductive in each of the pixel circuits.

Furthermore, in the display device, each of the pixel circuits may further include a second switching element provided between the source electrode of the drive transistor and the second electrode of the first capacitive element, and the method of controlling the display device may further include, in each of the pixel circuits, switching the second switching element to the non-conducting state, and holding the data voltage by the first capacitive element and the second capacitive element.

With this control method, the same advantageous effects as described above can be produced by the pixel circuit.

Hereinafter, embodiments of the present invention shall be described. It is to be noted that, in all the figures, the same reference signs are given to components that fulfill the same functions and redundant description thereof shall be omitted.

Embodiment 1

Hereinafter, Embodiment 1 of the present invention shall be described with reference to the Drawings. The display device in Embodiment 1 is a display device which includes a display unit having plural pixel circuits arranged in a matrix, each including two transistors, two capacitors, and one organic EL element, and causes the organic EL element to emit light at a more accurate and stable luminance without being affected by the power source voltage change.

FIG. 1 is a function block diagram showing an example of the configuration of a display device 1 according to Embodiment 1.

The display device 1 includes a display unit 2, a control circuit 3, a scanning line drive circuit 4, a signal line drive circuit 5, and a power source circuit 6.

The display unit 2 includes plural pixel circuits 10 that are arranged in a matrix. Each of rows in the matrix is provided with a scanning signal line connected in common to the pixel circuits 10 that are arranged in the same row, and each of the columns of the matrix is provided with a data signal line connected in common to the pixel circuits 10 that are arranged in the same column.

The control circuit 3 is a circuit that controls the operation of the display device 1, receives a video signal from an external source, and controls the scanning line drive circuit 4 and the signal line drive circuit 5 so that the image represented by the video signal is displayed by the display unit 2.

The scanning line drive circuit 4 supplies a control signal for controlling the operation on the pixel circuit 10, to the pixel circuit 10 via the scanning signal line.

The signal line drive circuit 5 supplies a data signal corresponding to the light-emitting luminance, to the pixel circuit 10 via the data signal line.

The power source circuit 6 supplies power for the operation of the display device 1, to the respective parts of the display device 1.

Figure 2:
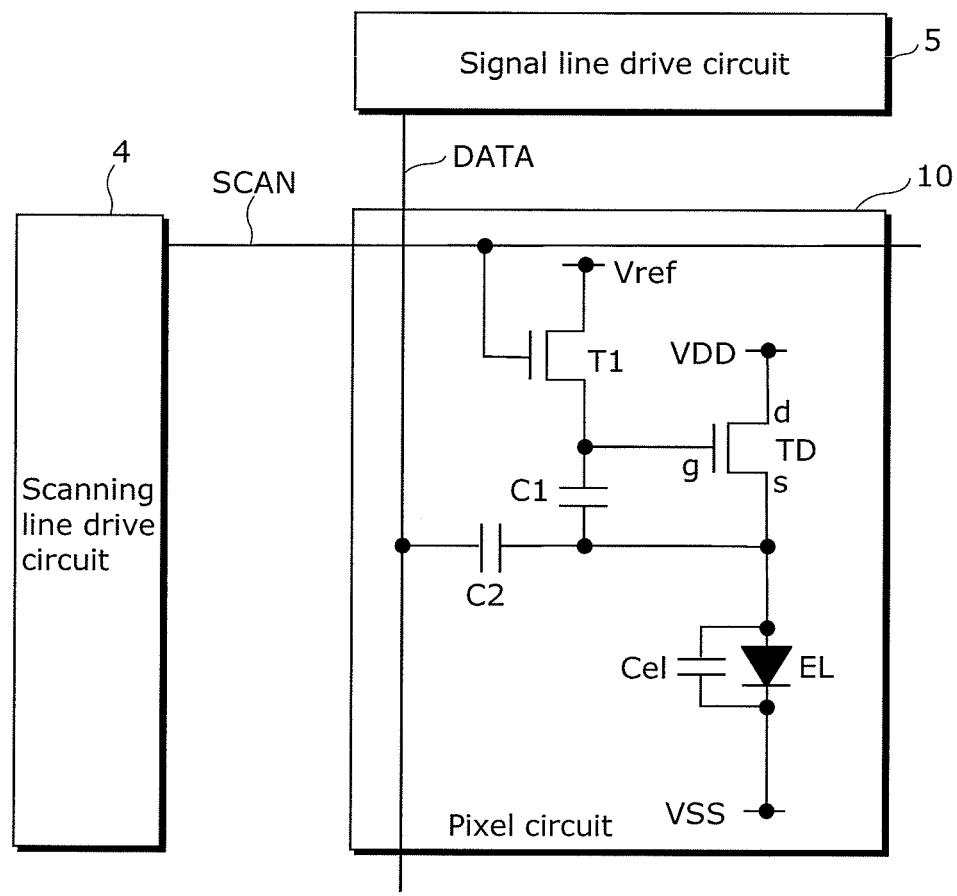
FIG. 2 is a circuit diagram showing an example of a configuration of a pixel circuit according to Embodiment 1.

FIG. 2 is a circuit diagram showing an example of the configuration of the pixel circuit 10, and an example of the connections between the pixel circuit 10, the scanning line drive circuit 4, and the signal line drive circuit 5.

A signal line SCAN is provided, as a scanning signal line, in each of the rows of the display unit 2, and a data line DATA is provided, as a data signal line, in each of the columns of the display unit 2.

Furthermore, the display unit 2 is provided with a power source line VDD for transmitting and distributing to the pixel circuit 10 the power source voltage outputted from the power source circuit 6, a power source line VSS for transmitting and distributing to the pixel circuit 10 the power source voltage outputted from the power source circuit 6, and a reference voltage line Vref for transmitting and distributing to the pixel circuit 10 the fixed reference voltage outputted from the power source circuit 6. The power source lines VDD and VSS and the reference voltage line Vref are connected in common to all of the pixel circuits 10.

A complicated voltage change due to voltage drop caused by electric resistance occurs at the connecting points of the pixel circuit 10 and each of the power source lines VDD and VSS each supply a current to the organic EL element EL. In contrast, no steady voltage drop occurs at the reference voltage line Vref that does not supply a direct current.

Each pixel circuit 10 placed in the display unit 2 is connected to the scanning line drive circuit 4 via the signal line SCAN of the row on which the pixel circuit 10 is placed, and connected to the signal line drive circuit 5 via the data line DATA of the row on which the pixel circuit 10 is placed.

The signal line SCAN transmits a control signal for controlling the operation on the pixel circuit 10, from the scanning line drive circuit 4 to the pixel circuit 10. The data line DATA transmits a data signal corresponding to the light-emitting luminance, from the signal line drive circuit 5 to the pixel circuit 10.

The pixel circuit 10 is a circuit that causes the organic EL element to emit light at a luminance corresponding to the data signal, and includes a drive transistor TD, a switching transistor T1, capacitors C1 and C2, and an organic EL element EL. Each of the drive transistor TD and the switching transistor T1 is configured of an N-type thin-film transistor (TFT).

The drive transistor TD has a drain electrode d that is connected to the power source line VDD.

The capacitor C1 has a first electrode (at the top side of the illustration) that is connected to a gate electrode g of the drive transistor TD, and a second electrode (at the bottom side of the illustration) that is connected to a source electrode s of the drive transistor TD.

The capacitor C2 has a first electrode (at the right side of the illustration) that is connected to the second electrode of the capacitor C1, and a second electrode (at the left side of the illustration) that is connected directly to the data line. In the present description, it is defined that to be connected directly is to be electrically connected by simple conductive material such as wiring and contact hole without other elements intervened therebetween.

The switching transistor T1 switches between conduction and non-conduction between the gate electrode g of the drive transistor TD and the reference voltage line Vref.

The organic EL element EL has a first electrode (at the top side of the illustration) that is connected to the source electrode of the drive transistor TD, a second electrode (at the bottom side of the illustration) that is connected to the power source line VSS, and a parasitic capacitance Cel.

Here, the switching transistor T1 is an example of the first switching element, and the capacitors C1 and C2 are examples of the first capacitive element and the second capacitive element, respectively, and the organic EL element EL is an example of the light-emitting device. Furthermore, the power source line VDD is an example of the first power source line, and the power source line VSS is an example of the second power source line. Furthermore, the data signal is an example of the data voltage.

Figure 3:
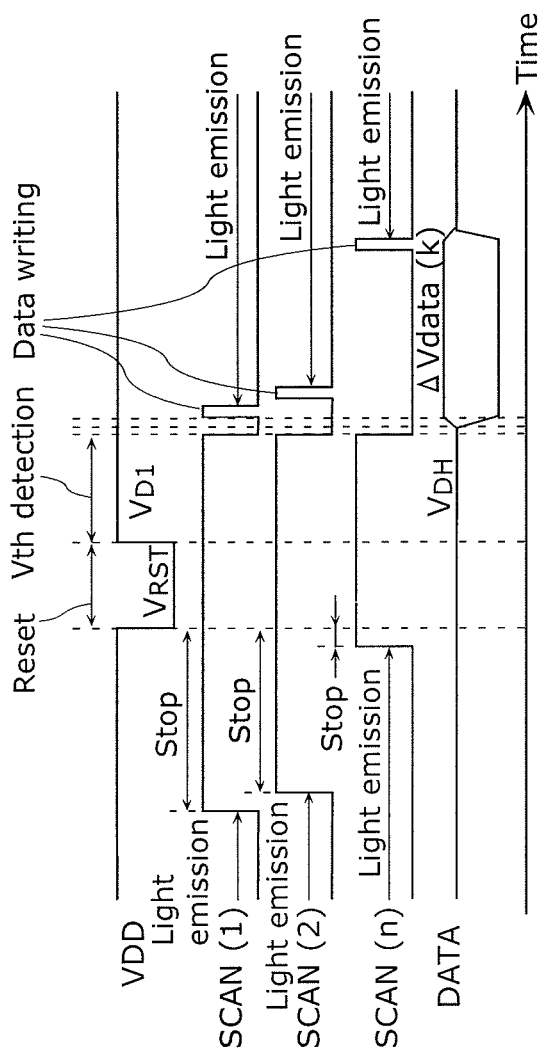
FIG. 3 is a timing chart showing an example of a control signal, power source voltage, and data signal according to Embodiment 1.

FIG. 3 is a timing chart showing an example of the control signal, power source voltage, and data signal for operating the pixel circuit 10, for one frame period. In FIG. 3, the vertical axis denotes the level of each signal, and the horizontal axis represents the passing of time. To facilitate description, the control signal, the data voltage, and the power source voltage are given the same names as the respective signal lines and power source lines through which they are transmitted.

Since the switching transistor T1 of the pixel circuit 10 is configured of an N-type transistor, in the switching transistor T1, there is a conducting state in a period in which the control signal SCAN is at the HIGH level, and there is a non-conducting state in a period in which the control signal SCAN is at the LOW level.

The operation on the pixel circuit 10 performed according to the control signal and the data signal shown in FIG. 3 shall be described with reference to (a) to (d) in FIG. 4.

Figure 4:
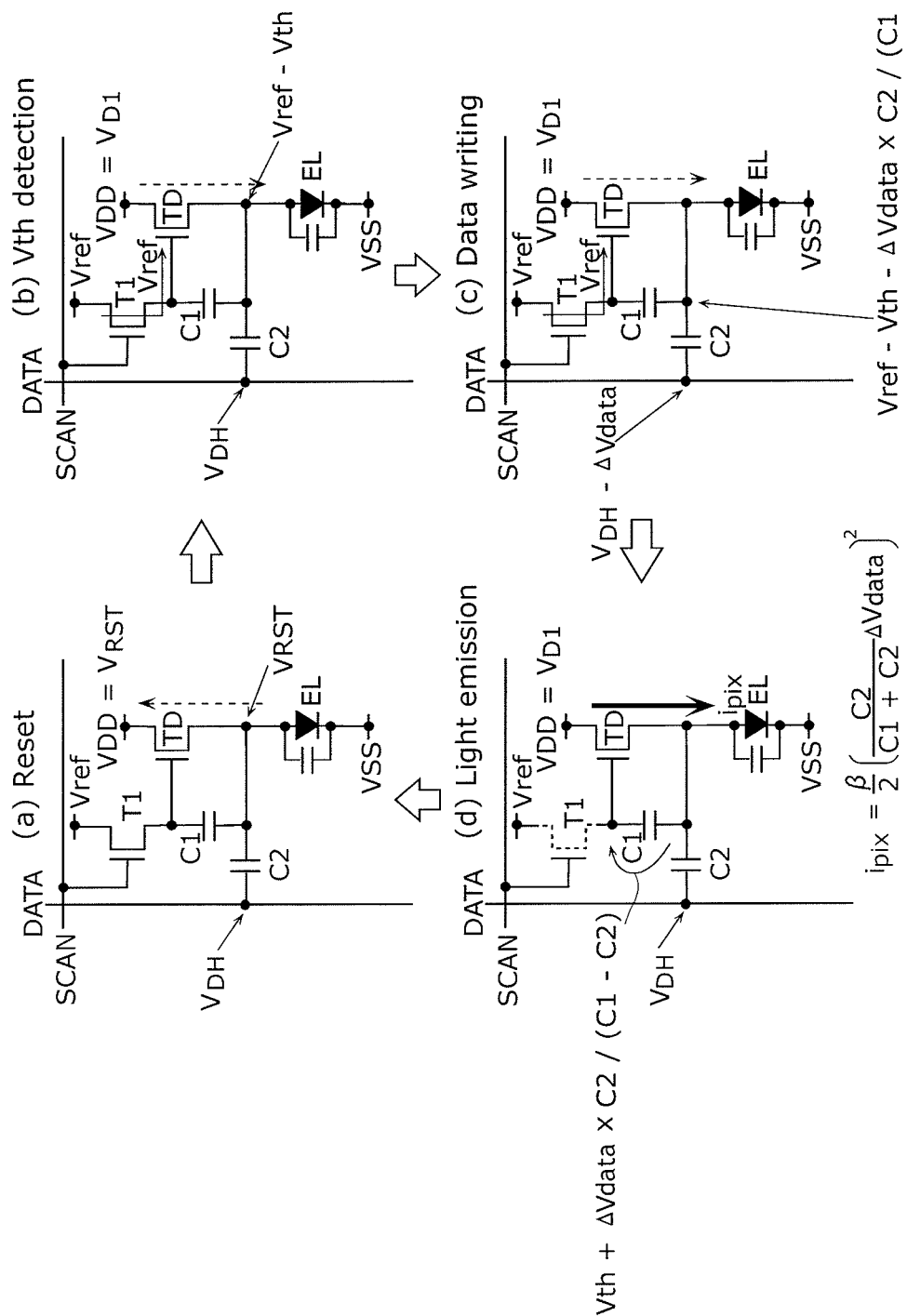
FIGS. 4(a)-(d) are circuit diagrams showing an example of the operation on a pixel circuit according to Embodiment 1.

In FIG. 4, (a) is a circuit diagram illustrating the reset operation on the pixel circuit 10 performed in the reset period. The reset operation on the pixel circuit 10 is performed all together for the pixel circuits 10 of all of the rows.

In the reset operation on the pixel circuit 10, the power source voltage VDD is set to a voltage $V_{RST}$, and the reference voltage Vref is applied to the gate electrode g of the drive transistor TD via the switching transistor T1. An example of the voltage $V_{RST}$ is a voltage lower than the voltage (Vref−Vth) obtained by subtracting the threshold voltage Vth of the drive transistor TD from the reference voltage Vref obtained at a time of Vth detection described later. Thus, as the reference potential Vref, a voltage higher than a voltage $V_{RST}$+Vth obtained by adding the positive power source voltage $V_{RST}$ and the threshold voltage Vth of the drive transistor TD is used, for example. With this, the drive transistor TD is turned into the ON state, and the reset operation is preformed for setting the anode voltage of the organic EL element EL to $V_{RST}$.

The voltage $V_{RST}$ may be lower than the voltage obtained by adding the power source voltage VSS and the light-emission start voltage (Vth (EL)) of the organic EL element EL. Specifically, $V_{RST}$<Vref−Vth<VSS+Vth (EL). With this, the light emission by the organic EL element EL is deterred in the stop period, reset period, and Vth detection period, thereby suppressing deterioration in display contrast and increase in power consumption due to unnecessary light emission by the organic EL element EL.

In FIG. 4, (b) is a circuit diagram illustrating the Vth detection operation on the pixel circuit 10 performed in the Vth detection period. The Vth detection operation on the pixel circuit 10 is performed all together for the pixel circuits 10 of all of the rows.

In the Vth detection operation on the pixel circuit 10, the power source voltage VDD is set to a positive power source voltage $V_{D1}$ (>Vref−Vth) that is higher than the voltage obtained by subtracting from the reference voltage Vref the maximum value of the threshold voltage Vth of the drive transistors TD of all of the pixels, and the reference voltage Vref is applied to the gate electrode of the drive transistor TD via the switching transistor T1.

As a result, in the Vth detection operation, the drive transistor TD always operates in the saturation region, and thus the drain-source current of the drive transistor TD is controlled only by the voltage between the gate electrode and the source electrode. At this time, the gate electrode g of the drive transistor TD is fixed to the reference voltage Vref, and thus the drain-source current of the drive transistor TD is controlled by the voltage of the source electrode s after all.

The source electrode s of the drive transistor TD is connected with the second electrode (at the bottom side of the illustration) of the capacitor C1, and the drain-source current of the drive transistor TD flows to the capacitor C1. Thus, the capacitor C1 is charged, and when the voltage of the second electrode of the capacitor C1, i.e. the voltage of the source electrode s of the drive transistor TD, increases from $V_{RST}$ and eventually reaches Vref−Vth, that is when the voltage between the gate electrode and the source electrode of the drive transistor TD becomes equal to the threshold voltage Vth of the drive transistor TD, the drive transistor TD is turned into the OFF state.

In this manner, the voltage of the source electrode s of the drive transistor TD converges to the voltage Vref−Vth that has dropped from the reference voltage Vref by the threshold voltage Vth.

Furthermore, the data voltage DATA is set to $V_{DH}$, and the voltage Vref−Vth is held by the capacitor C1 based on the reference voltage Vref and held by the capacitor C2 based on the data voltage $V_{DH}$.

In FIG. 4, (c) is a circuit diagram illustrating the data writing operation on the pixel circuit 10 performed in the data writing period. The data writing operation on the pixel circuit 10 is performed in different periods for the pixel circuits 10 of each row. In the mathematical expressions shown in (c) in FIG. 4, the index (k) identifying the row on which the data writing operation is performed is omitted to simplify the explanation.

In the data writing operation on the pixel circuit 10 in the k-th row, the data voltage DATA is set to a voltage $V_{DH}$−ΔVdata (k) that is obtained by subtracting from $V_{DH}$ an amount ΔVdata (k) corresponding to the luminance at which the pixel circuits 10 of the k-th row are to emit light. After that, there is a conducting state in the switching transistor T1 of the pixel circuit 10. The voltage of the source electrode s of the drive transistor TD, that is the connecting point of the capacitors C1 and C2, varies according to the drop amount ΔVdata (k) of the data voltage DATA and a coefficient C2/(C1+C2) determined based on the capacitance of the capacitors C1 and C2. As a result, the voltage of the source electrode s of the drive transistor TD becomes Vref−Vth−ΔVdata(k)×C2/(C1+C2).

At this time, the drive transistor TD is turned into the ON state again, and through the same operation as the above-described Vth detection operation, the voltage of the source electrode s of the drive transistor TD, i.e. the voltage of the connecting point of the capacitors C1 and C2, starts to increase again toward the voltage Vref−Vth. In order to maintain the voltage of the connecting point of the capacitors C1 and C2 as correct as possible, the length of data writing period, that is the conduction time period of the switching transistor T1, may be restricted to be short enough with respect to the speed of increase in the voltage of the source electrode s of the drive transistor TD, for example. Alternatively, the voltage of the source electrode s of the drive transistor TD may be set to the voltage corresponding to β of the drive transistor TD by appropriately setting the conduction time period of the switching transistor T1. Here, β=μ×Cox× W/L, where μ represents a mobility, Cox represents a gate dielectric capacitance per unit area, W represents a width, and L represents a channel length.

In FIG. 4, (d) is a circuit diagram illustrating the light-emission operation on the pixel circuit 10 performed in the light-emission period. The light-emission operation on the pixel circuit 10 is performed in a different light-emission period subsequent to the data writing period in the pixel circuit 10 of each row.

In the light-emission operation on the pixel circuit 10, the power source voltage VDD is set to a voltage $V_{D1}$ for light emission by the organic EL element EL, and a voltage Vth+ $\Delta$Vdata×C2/(C1+C2) held by the capacitor C1 is applied between the gate electrode g and the source electrode s of the drive transistor TD.

As a result, a current $i_{pix}=2\times(C2/(C1+C2))\times\Delta Vdata)^2$ that has a magnitude corresponding to the data voltage Vdata is supplied from the drive transistor TD to the organic EL element EL, and the organic EL element EL emits light at a luminance corresponding to the magnitude of the current $i_{pix}$.

Then, by switching the switching transistor T1 to the conducting state in a time period during which the data voltage DATA is set to $V_{DH}$, the reference voltage Vref is applied to the gate electrode g of the drive transistor TD, the drive transistor TD is turned into the OFF state, and the light-emitting state is stopped.

As described above, the pixel circuit 10 significantly reduces the effect of the threshold voltage Vth by performing the Vth detection operation and reset operation, in the same manner as the conventional pixel circuit 90. In addition, the magnitude of the current $i_{pix}$ of the pixel circuit 10 does not depend on any of the power source voltage and the parasitic capacitance of the organic EL element EL, which eliminates the first and second error causes in the light-emitting luminance pointed out in the Technical Problem section.

Accordingly, with the pixel circuit 10, it is possible to cause the organic EL element EL to emit light at a more accurate and stable luminance than in the conventional technique.

As described above, the pixel circuit 10 produces advantageous effects of allowing light emission at a more correct and stable luminance than in the conventional technique with a fairly simple configuration including two transistors, two capacitors, and one organic EL element. However, there is a concern that the following problems may be caused. The data writing period is restricted to a very short period to set a correct voltage to the capacitors C1 and C2. The display image quality is lowered (cross talk, etc.) because the pixel current in the pixel circuit 10 which started the light-emission operation earlier becomes unstable while the writing operation is performed on the pixel circuits of other rows, under the situation where the data voltage DATA varies until the writing operation on all of the rows is finished.

Hereinafter, embodiments which address these problems shall be described.

Embodiment 2

Hereinafter, Embodiment 2 of the present invention shall be described with reference to the Drawings.

The pixel circuit according to Embodiment 2 is configured by modifying the pixel circuit 10 to address the outstanding issue of the pixel circuit 10 that is the restriction of the data writing period to a very short period.

Figure 5:
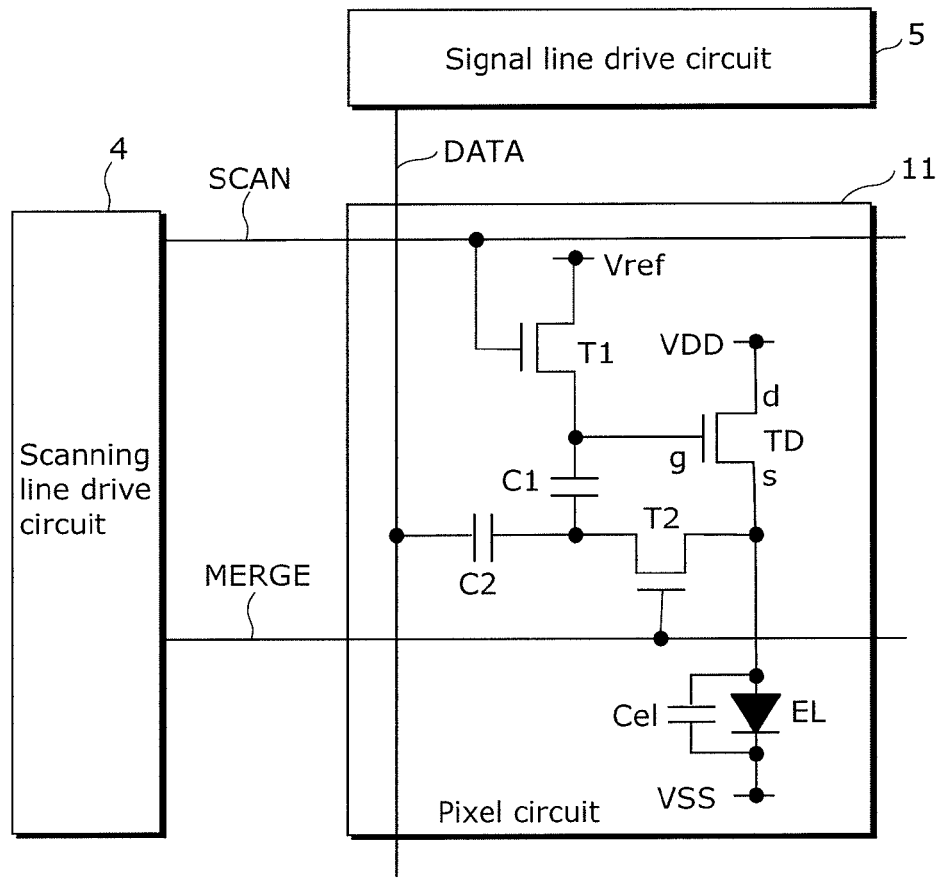
FIG. 5 is a circuit diagram showing an example of a configuration of a pixel circuit according to Embodiment 2.

FIG. 5 is a function block diagram showing an example of the configuration of a pixel circuit 11 according to Embodiment 2. Compared to the pixel circuit 10, the pixel circuit 11 is different in that a switching transistor T2 is provided between the second electrode (at the bottom side of the illustration) of the capacitor C1 and the source electrode s of the drive transistor TD. In the switching transistor T2, there is a non-conducting state in the data writing period, which eliminates the effect of the change in voltage of the source electrode s of the drive transistor TD that occurs in the above-described data writing period, and alleviates the restriction on the length of the data writing period. A signal line MERGE is added to each row of the display unit 2 corresponding to the pixel circuit 11.

In the pixel circuit 11, the switching transistor T2 switches between the conduction and non-conduction between the second electrode (at the bottom side of the illustration) of the capacitor C1 and the source electrode s of the drive transistor TD, according to the control signal transmitted via the signal line MERGE.

Figure 6:
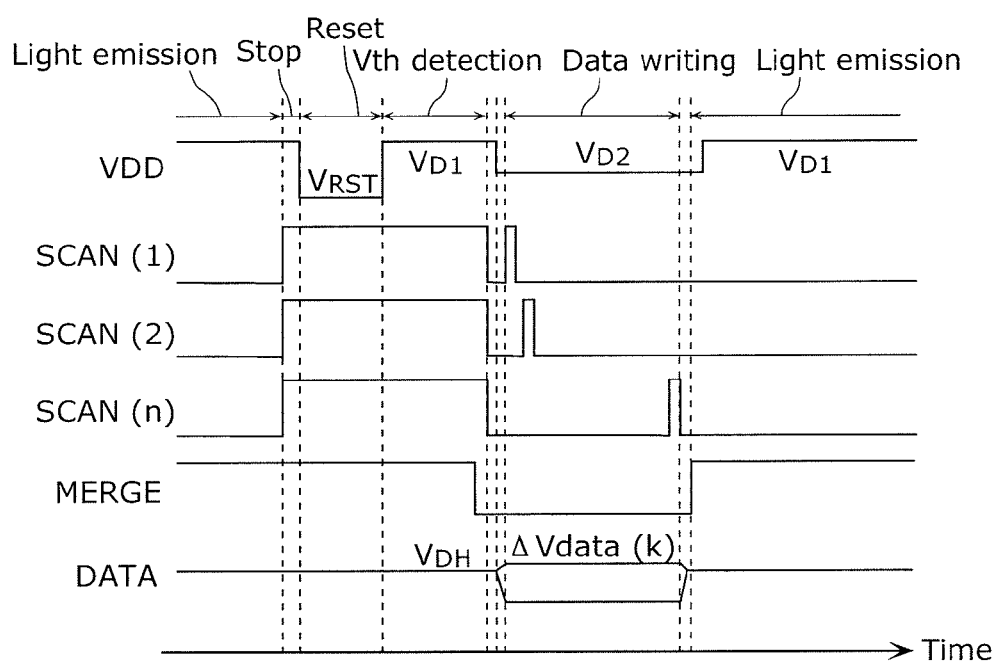
FIG. 6 is a timing chart showing an example of a control signal, power source voltage, and data signal according to Embodiment 2.

FIG. 6 is a timing chart showing an example of the control signal and data signal for operating the pixel circuit 11, for one frame period. In FIG. 6, the vertical axis denotes the level of each signal, and the horizontal axis represents the passing of time. To facilitate description, the control signal, the data voltage, and the power source voltage are given the same names as the respective signal lines and power source lines through which they are transmitted.

The operation on the pixel circuit 11 performed according to the control signal and the data signal shown in FIG. 6 shall be described with reference to (a) to (d) in FIG. 7.

Figure 7:
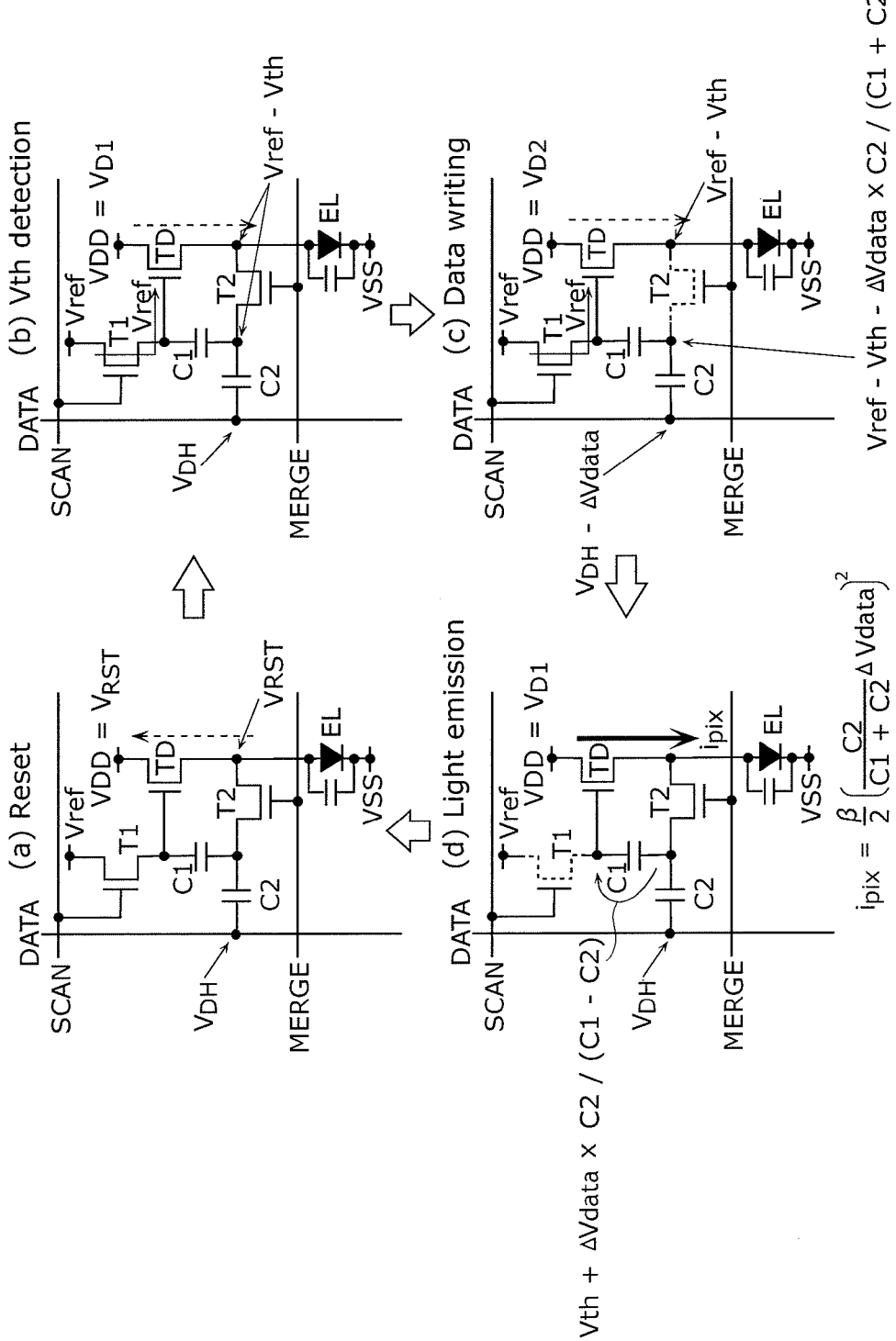
FIGS. 7(a)-(d) are circuit diagrams showing an example of the operation on a pixel circuit according to Embodiment 2.

In FIG. 7, (a) is a circuit diagram illustrating the reset operation on the pixel circuit 11 performed in the reset period. The reset operation on the pixel circuit 11 is performed all together for the pixel circuits 11 of all of the rows, after the light-emission operation of the preceding frame is finished. Although FIG. 6 shows an example in which the light-emission operation is finished by rising the control signals SCAN (k) for all of the rows simultaneously, the light-emission operation may be finished by casing the power source voltage VDD to fall before rising the control signals SCAN (k).

The reset operation on the pixel circuit 11 is basically the same as the reset operation on the pixel circuit 10, and the drive transistor TD is turned into the ON state by application of the voltage described in (a) in FIG. 4. Furthermore, particularly when a capacitance value of the organic EL element EL in reverse bias is approximately the same as a capacitance value of the capacitor C2, the switching transistor T2 may be switched to the conducting state in the reset period.

In FIG. 7, (b) is a circuit diagram illustrating the Vth detection operation on the pixel circuit 11 performed in the Vth detection period. The Vth detection operation on the pixel circuit 11 is performed all together for the pixel circuits 11 of all of the rows.

The Vth detection operation on the pixel circuit 11 is basically the same as the Vth detection operation on the pixel circuit 10, and the voltage of the source electrode s of the drive transistor TD is caused to converge to the voltage Vref−Vth that has dropped from the reference voltage Vref by the threshold voltage Vth, by the application of the voltage described in (b) in FIG. 4.

Although FIG. 6 shows an example in which the Vth detection operation is finished by causing the control signals SCAN (k) to fall for all of the rows simultaneously, the Vth detection operation may be finished by casing the control signal MERGE to fall before causing the control signals SCAN (k) to fall. After the fall of control signals SCAN (k) or fall of the control signals MERGE of all of the rows, the power source voltage VDD is dropped to a voltage $V_{D2}$ that is for data writing described later.

In FIG. 7, (c) is a circuit diagram illustrating the data writing operation on the pixel circuit 11 performed in the data writing period. The data writing operation on the pixel circuit 11 is performed in different periods for the pixel circuits 11 of each row. In the mathematical expressions shown in (c) in FIG. 7, the index (k) identifying the row on which the data writing operation is performed is omitted to simplify the explanation.

The data writing operation on the pixel circuit 11 is different from the data writing operation on the pixel circuit 10, and is performed in a state where the switching transistor T2 is in the non-conducting state, that is where the source electrode s of the drive transistor TD and the connecting point of the capacitors C1 and C2 are electrically separated. Accordingly, a voltage obtained by superimposing a voltage dependent on the data voltage onto the voltage Vth that is maintained correctly can be set for the node of the connecting point of the capacitors C1 and C2.

In the data writing period, the power source voltage VDD is set to the voltage $V_{D2}$. The voltage $V_{D2}$ is a voltage lower than the voltage $V_{D1}$ that is set as the power source voltage VDD during the Vth detection period and the light-emission period. The voltage $V_{D2}$ may be $V_{D2}$<VSS+Vth (EL), that is lower than the voltage obtained by adding the power source voltage VSS and the light-emission start voltage (Vth(EL)) of the organic EL element EL, and may be equal to the power source voltage VEE.

Furthermore, during the data writing period, in the pixel circuits of a row on which the data writing operation is performed, the switching transistor T1 is switched to the conducting state, the switching transistor T2 is switched to the non-conducting state, and the capacitors C1 and C2 are connected in series between the data line DATA and the reference voltage line Vref. However, in the pixel circuits of other rows, the switching transistors T1 and T2 are in the non-conducting state, and thus the data line DATA is not connected to any of the reference voltage line Vref and the power source lines VDD and VSS via the capacitors C1 and C2.

Specifically, in the data writing period in which it is required to vary at a high speed the voltage of the data line DATA to a voltage corresponding to the luminance of each row, the load capacitance of the data line DATA can be suppressed to a capacitance obtained by adding the capacitance caused by the inter-wire cross of the signal line SCAN and the data line DATA, etc., and pixel capacitance of the pixel in which the switching transistor T1 is in the conducting state. Here, the pixel capacitance is m×C1×C2/(C1+C2), where m represents the number of signal lines SCAN having an ON voltage for switching the switching transistor T1 to the conducting state.

In FIG. 7, (d) is a circuit diagram illustrating the light-emission operation on the pixel circuit 11 performed in the light-emission period. The light-emission operation on the pixel circuit 11 is performed all together for the pixel circuits 11 of all of the rows.

The light-emission operation on the pixel circuit 11 is different from the light-emission operation on the pixel circuit 10. After the data writing operation on the pixel circuits 11 of all of the rows is finished, the rising of the control signal MERGE is completed, and the power source voltage VDD is caused to fall. Then, the light-emission operation on the pixel circuit 11 is started all together for all of the rows. As a result, the organic EL element EL emits light with no change in voltage of the data line DATA. Thus, a more stable light-emitting luminance can be obtained than in the pixel circuit 10.

As described above, the pixel circuit 11 not only produces the same advantageous effects as the pixel circuit 10 does, but also alleviates the outstanding problem of the pixel circuit 10 that is the restriction of data writing period to a very short period. Accordingly, with the pixel circuit 11, it is possible to cause the organic EL element EL to emit light at a more accurate and stable luminance than in the conventional technique.

A possible modification of the pixel circuit 11 shall be described below.

Figure 8:
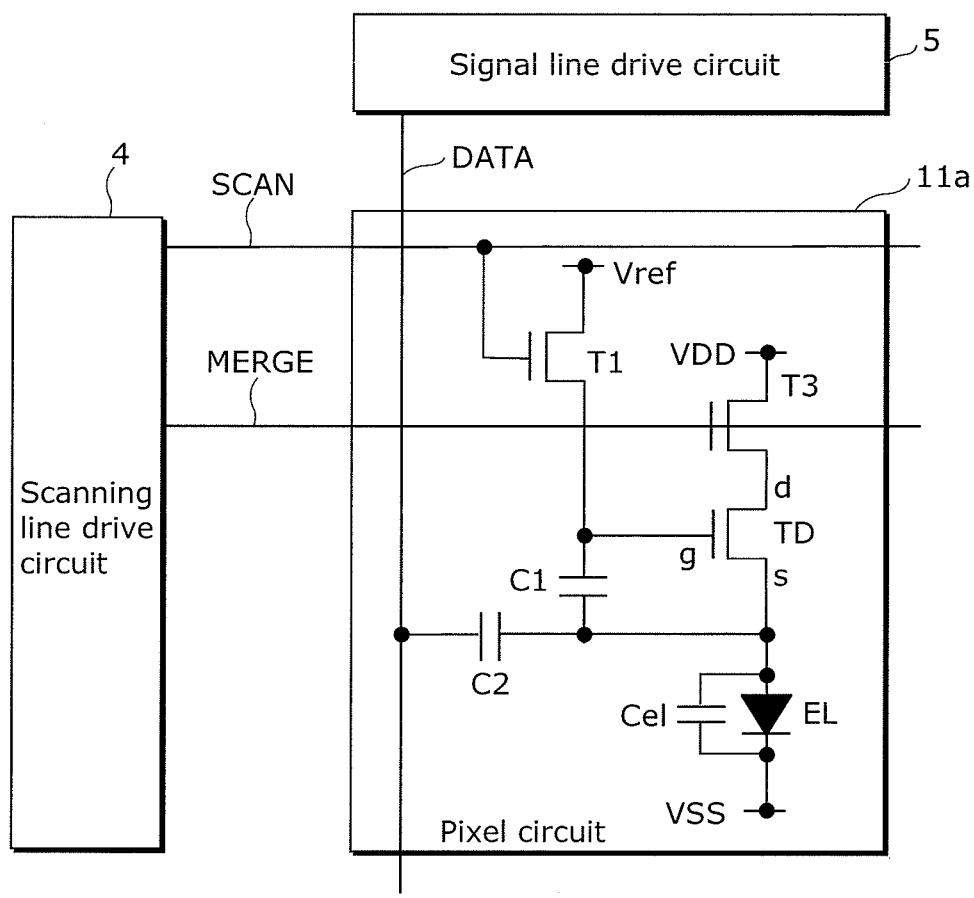
FIG. 8 is a circuit diagram showing an example of a configuration of a pixel circuit according to a modification of Embodiment 2.

For example, as a pixel circuit 11a shown in FIG. 8, the switching transistor T2 may be omitted, the connecting point of the capacitors C1 and C2 may be directly connected to the source electrode s of the drive transistor TD, and the switching transistor T3 may be placed between the drain electrode d of the drive transistor TD and the power source voltage VDD. When the control signal as shown in FIG. 6 for controlling the pixel circuit 11 is supplied, the pixel circuit 11a performs basically the same operation as the pixel circuit 11 does.

Figure 9:
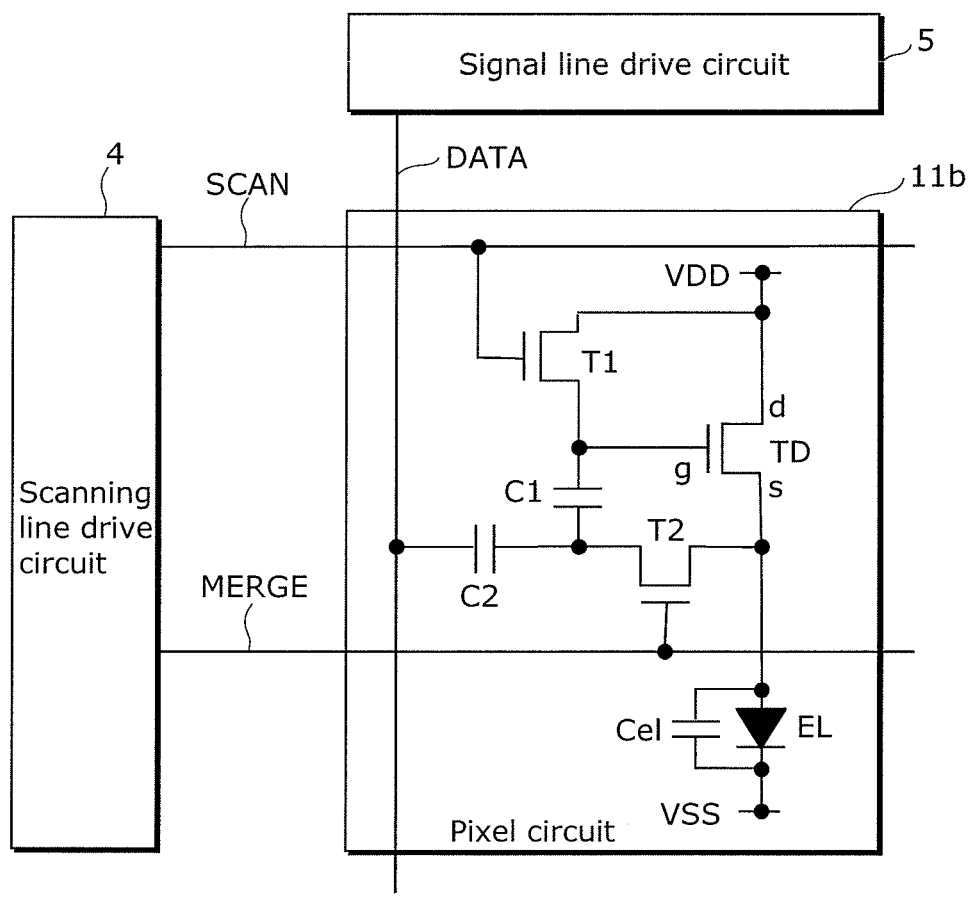
FIG. 9 is a circuit diagram showing an example of a configuration of a pixel circuit according to the modification of Embodiment 2.

Furthermore, for example, the power source voltage VDD may be used as the reference potential Vref, as a pixel circuit 11b shown in FIG. 9. The pixel circuit 11b may be applied when the drive transistor TD is of enhancement type (Vth>0). With the pixel circuit 11b, the reference voltage line Vref is omitted and the wiring area can be reduced, which improves the arrangement density of the pixel circuits 11b and contributes to realization of a high-definition display device.

Embodiment 3

Embodiment 3 of the present invention shall be described with reference to the Drawings.

The pixel circuit according to Embodiment 3 is configured by modifying the pixel circuit 10 to address the outstanding issue of the pixel circuit 10 that is the unstable light-emission operation during the writing operation on pixel circuits of other rows.

Figure 10:
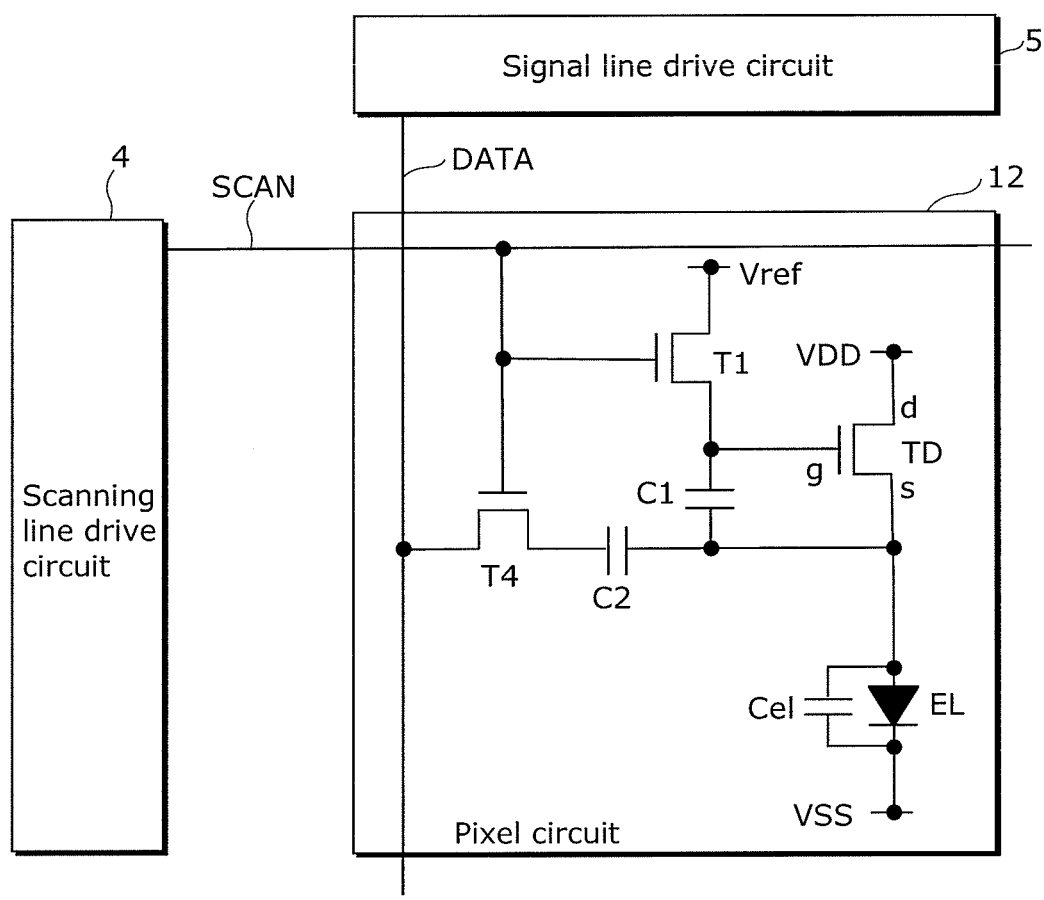
FIG. 10 is a circuit diagram showing an example of a configuration of a pixel circuit according to Embodiment 3.

FIG. 10 is a function block diagram showing an example of a configuration of a pixel circuit 12 according to Embodiment 3. Compared to the pixel circuit 10 shown in FIG. 2, the pixel circuit 12 is different in that a switching transistor T4 is provided between the data line DATA and the second electrode (at the left side of the illustration) of the capacitor C2.

The switching transistor T4 switches between conduction and non-conduction between the data line DATA and the second electrode of the capacitor C2 according to the control signal transmitted via the signal line SCAN.

When the control signal as shown in FIG. 3 for controlling the pixel circuit 10 is supplied, the pixel circuit 12 performs basically the same operation as the pixel circuit 10 does, to produce the same advantageous effects as the pixel circuit 10 does.

Moreover, with the pixel circuit 12, the switching transistor T4 is switched to the non-conducting state at least in the light-emission period, which electrically separates the pixel circuit 12 from the data line DATA. This prevents the pixel current in the pixel circuit 12 started the light-emission operation earlier from being unstable during the writing operation on the pixel circuits of other rows, which eliminates the problem of display image quality.

As described above, the pixel circuit 12 produces the same advantageous effects as the pixel circuit 10 does, and further realizes stabilization of the light-emission operation during the writing operation on the pixel circuits of other rows. Accordingly, with the pixel circuit 12, it is possible to cause the organic EL element EL to emit light at a more accurate and stable luminance than in the conventional technique.

Although the switching transistor T4 is placed between the second electrode of the capacitor C2 and the data line DATA in FIG. 10, the switching transistor T4 may be placed between the first electrode (at the right side of the illustration) of the capacitor C2 and the connecting point of the source electrode s of the drive transistor TD and the second electrode (at the bottom side of the illustration) of the capacitor C1.

Embodiment 4

Embodiment 4 of the present invention shall be described with reference to the Drawings.

The pixel circuit according to Embodiment 4 is configured by modifying the pixel circuit 12, to address the problem which has not been solved with the pixel circuit 12, that is the restriction of data writing period to a very short period, out of the outstanding issues of the pixel circuit 10.

Figure 11:
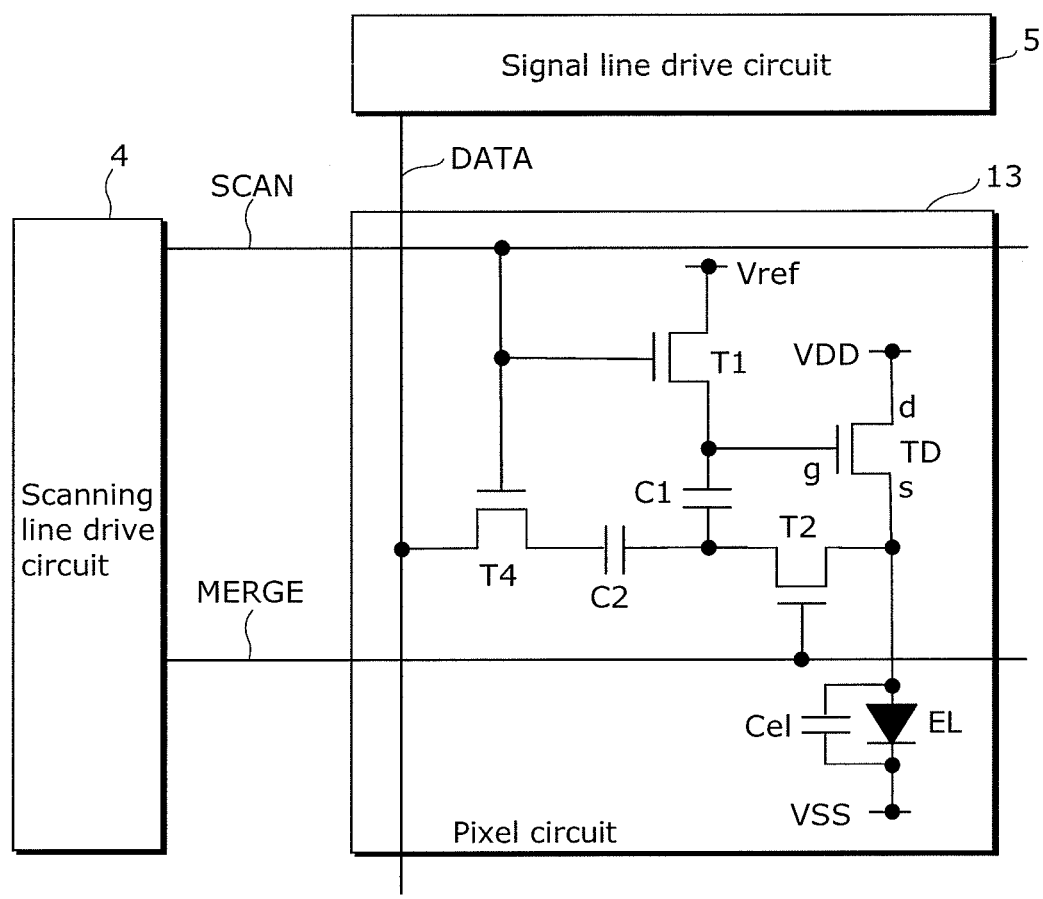
FIG. 11 is a circuit diagram showing an example of a configuration of a pixel circuit according to Embodiment 4.

FIG. 11 is a function block diagram showing an example of the configuration of a pixel circuit 13 according to Embodiment 4. Compared to the pixel circuit 12 shown in FIG. 10, the pixel circuit 13 is different in that a switching transistor T2 is provided between the second electrode (at the bottom side of the illustration) of the capacitor C1 and the source electrode s of the drive transistor TD. In the switching transistor T2, there is a non-conducting state in the data writing period, which eliminates the effect of the change in voltage of the source electrode s of the drive transistor TD that occurs in the above-described data writing period and alleviates the restriction on the length of the data writing period. A signal line MERGE is added to each row of the display unit 2 corresponding to the pixel circuit 13.

Figure 12:
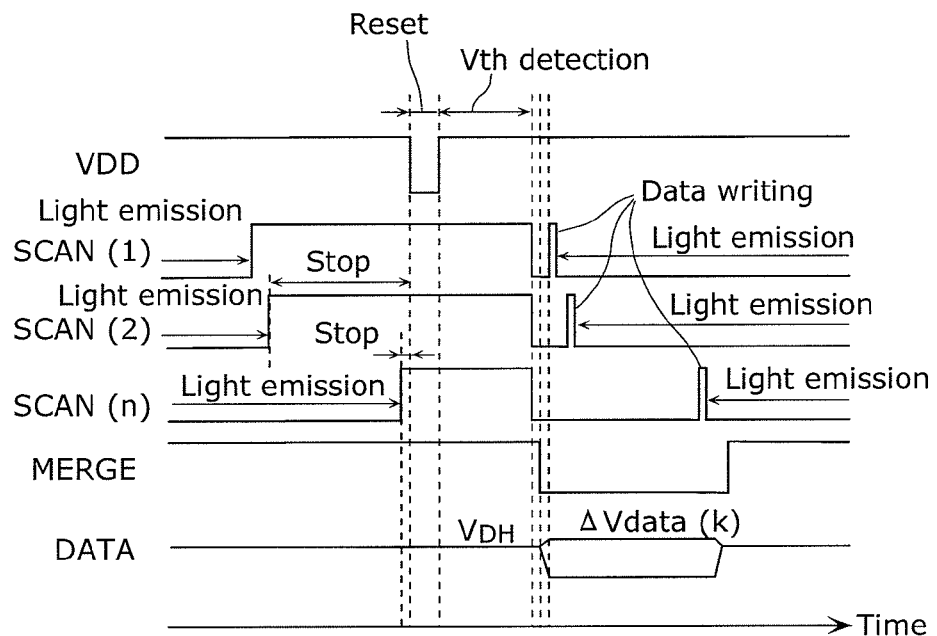
FIG. 12 is a timing chart showing an example of a control signal, power source voltage, and data signal according to Embodiment 4.

When the control signal as shown in FIG. 12 is supplied, the pixel circuit 13 performs basically the same operation as the pixel circuit 12 does, to produce the same advantageous effects as the pixel circuit 12 does.

Moreover, with the pixel circuit 13, the restriction on the length of the data writing period is alleviated by electrically separating the connecting point of the capacitors C1 and C2 from the source electrode s of the drive transistor TD, at least in the data writing period.

Figure 13:
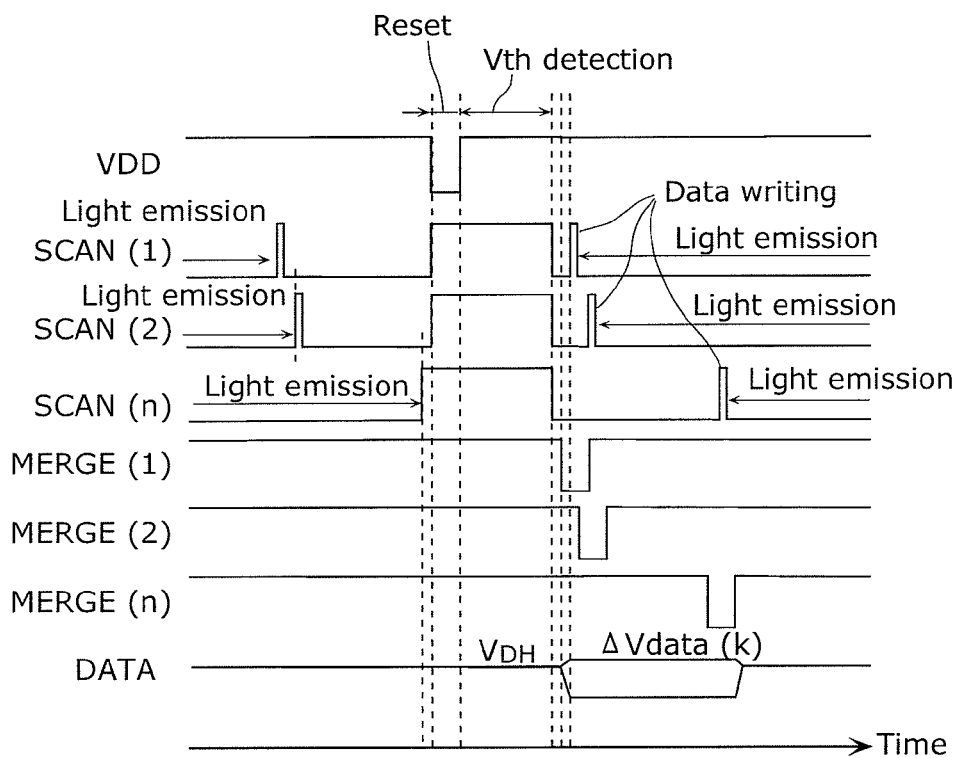
FIG. 13 is a timing chart showing another example of a control signal, power source voltage, and data signal according to Embodiment 4.

As shown in FIG. 13, an independent control signal MERGE (k) may be used for each row. In this case, the control signal MERGE (k) of each row is set to inactive (voltage level at which the switching transistor T2 is switched to the non-conducting state), in a period in which the control signal SCAN (k) of the row is active (voltage level at which the switching transistor T1 is switched to the conducting state).

As described above, the pixel circuit 13 produces the same advantageous effects as the pixel circuit 12 does, thereby solving the outstanding problems of the pixel circuit 10 that are the restriction of data writing period to a very short period and unstable light-emission operation during the writing operation on the pixel circuits of other rows. Accordingly, with the pixel circuit 13, it is possible to cause the organic EL element EL to emit light at a more accurate and stable luminance than in the conventional technique.

Embodiment 5

Embodiment 5 of the present invention shall be described with reference to the Drawings.

The pixel circuit according to Embodiment 5 is configured by modifying the pixel circuit 13 to address the outstanding issue of the pixel circuit 10 that is the unstable light-emission operation during the writing operation on pixel circuits of other rows.

Figure 14:
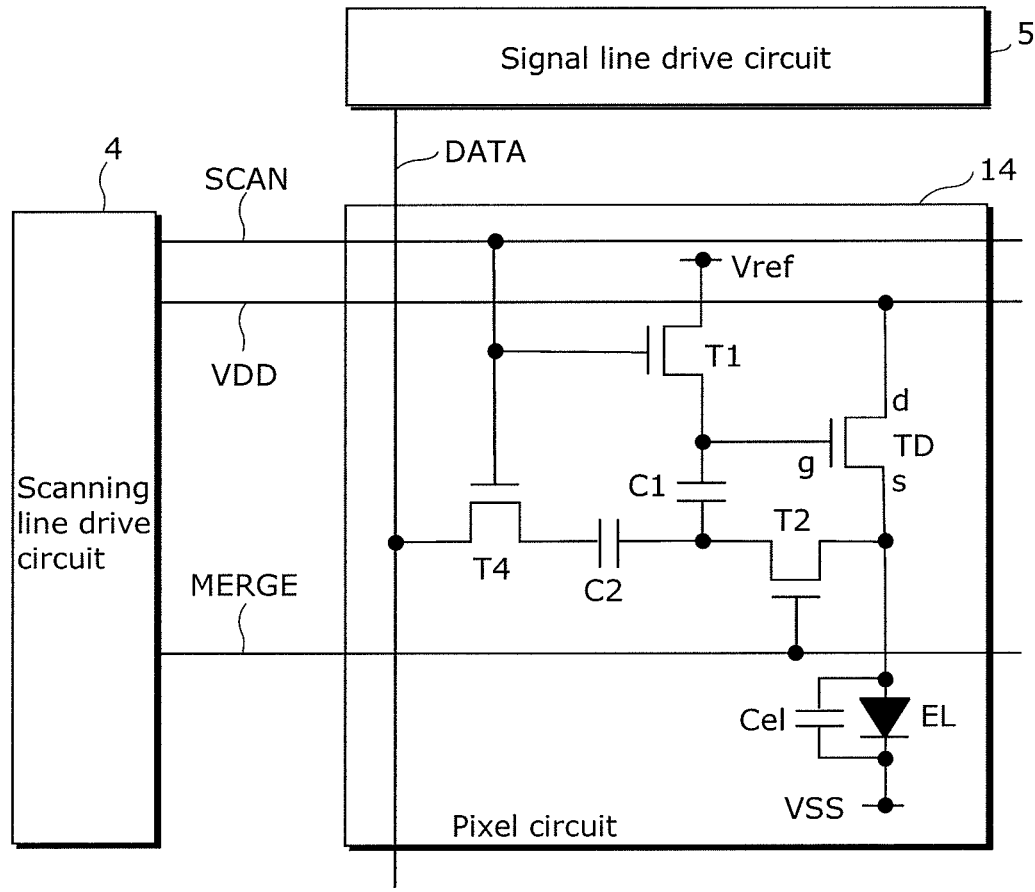
FIG. 14 is a circuit diagram showing an example of a configuration of a pixel circuit according to Embodiment 5.

FIG. 14 is a function block diagram showing an example of the configuration of a pixel circuit 14 according to Embodiment 5. Compared to the pixel circuit 13 shown in FIG. 11, the pixel circuit 14 is different in that each row is connected to an independent power source line VDD. The independent power source line VDD is provided for each row of the display unit 2 corresponding to the pixel circuit 14.

Figure 15:
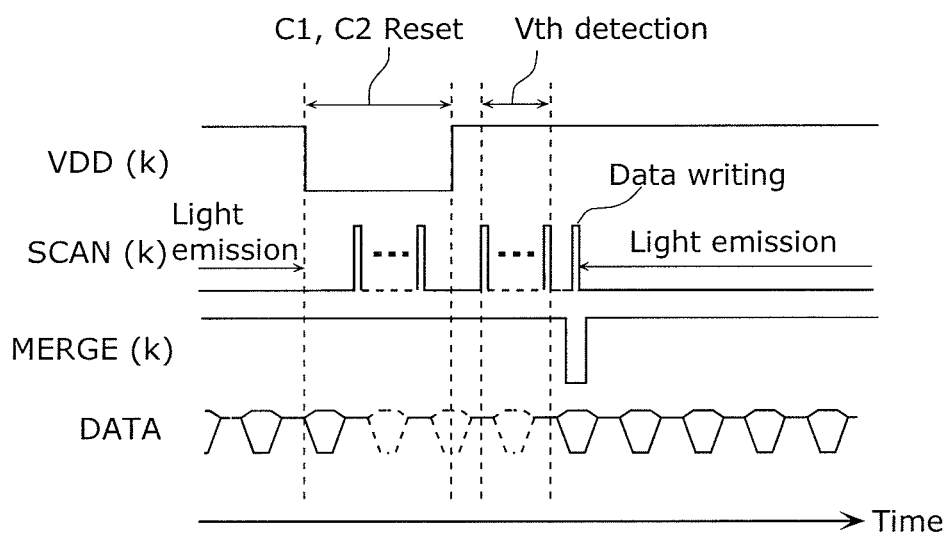
FIG. 15 is a timing chart showing an example of a control signal, power source voltage, and data signal according to Embodiment 5.

FIG. 15 is a timing chart showing an example of the power source voltage, control signal, and data signal for operating the pixel circuit 14, for one-frame period. In FIG. 15, the vertical axis denotes the level of each signal, and the horizontal axis represents the passing of time. The falling of the signal line SCAN (k) in the last pulse during the Vth detection period may be the same as the falling of the data writing pulse. Specifically, the rising of the data writing pulse may be the same as the rising of the last pulse in the Vth detection period.

The pixel circuit 14 solves the outstanding problem of the pixel circuit 10, which is the unstable light-emission operation during the writing operation on pixel circuits of other rows, by operating according to the power source voltage and the control signal shown in FIG. 15. Accordingly, with the pixel circuit 14, it is possible to cause the organic EL element EL to emit light at a more accurate and stable luminance than in the conventional technique.

Here, in the case where the pixel circuit in FIG. 14 is caused to operate according to the timing chart in FIG. 15, the reset operation and the Vth detection operation are performed by intermittently switching the switching transistors T1 and T4 to the conducting state at a time when the data line DATA is $V_{DH}$. However, a switching transistor T5 may be provided between the connecting point of the switching transistor T4 and the capacitor C2 and a fixed potential (reference voltage Vref and $V_{DH}$ for example), a switching transistor T6 may be provided between the reference voltage Vref and the gate electrode g of the drive transistor TD, and the switching transistors T5 and T6 may be turned into the ON state in the reset period and at a time of Vth detection. With this, the switching transistors T1 and T4 do not have to be intermittently switched to the conducting state. Thus, it is even possible to shorten the length of the reset period and Vth detection period by continuously providing the reset period and the Vth detection period.

Embodiment 6

Embodiment 6 of the present invention shall be described with reference to the Drawings.

In Embodiment 6, the pixel circuit configured of a P-type TFT shall be described.

Figure 16:
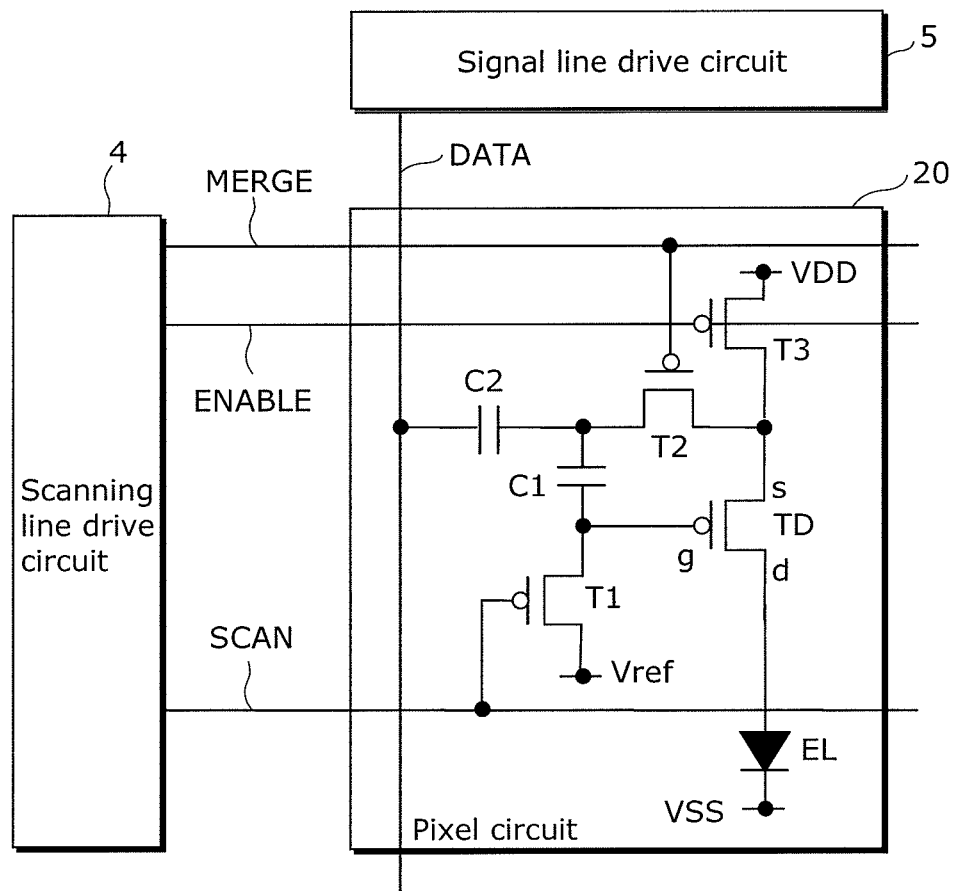
FIG. 16 is a circuit diagram showing an example of a configuration of a pixel circuit according to Embodiment 6.

Compared to the pixel circuit 11 shown in FIG. 5, the pixel circuit 20 shown in FIG. 16 is different in that all of the drive transistor TD and the switching transistors T1 and T2 are configured of P-type transistors, and a switching transistor T3 configured of the P-type transistor is added. The switching transistor T3 switches between conduction and non-conduction between the source electrode s of the drive transistor TD and the power source line VDD, according to the control signal transmitted via the signal line ENABLE.

The pixel circuit 20 is configured to perform basically the same operation as the pixel circuit 11 does, when a control signal is supplied that is obtained by simply inverting the level of the control signal for controlling the pixel circuit 11. Moreover, with the pixel circuit 20, light emission by the organic EL element EL can be deterred by switching the switching transistor T3 to the non-conducting state.

Figure 17:
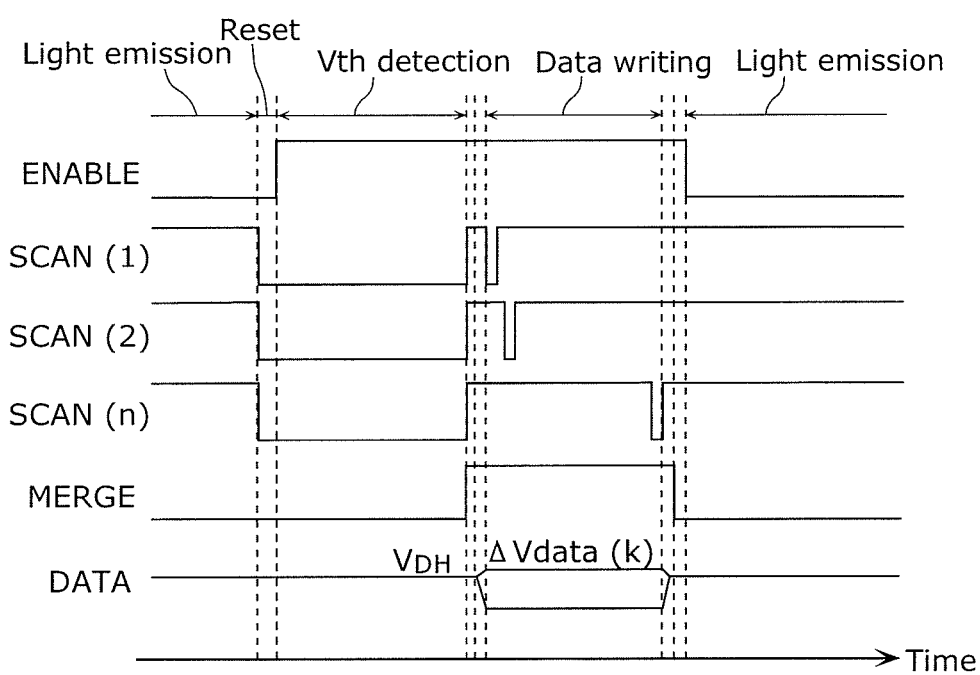
FIG. 17 is a timing chart showing an example of a control signal, power source voltage, and data signal according to Embodiment 6.

FIG. 17 is a timing chart showing an example of the control signal and the data signal for controlling the pixel circuit 20, for one-frame period. In FIG. 17, the vertical axis denotes the level of each signal, and the horizontal axis represents the time. The control signals shown in FIG. 17 include a control signal ENABLE for controlling the switching transistor T3, in addition to a control signal obtained by simply inverting the level of the corresponding control signal in FIG. 6.

The pixel circuit 20 performs, according to the control signal as shown in FIG. 17, basically the same operation as the pixel circuit 11 does, thereby alleviating the outstanding issue of the pixel circuit 10 that is the restriction of the data writing period to a very short period.

Moreover, after the data writing operation has finished for the pixel circuits 20 of all of the rows, the control signal MERGE becomes active (voltage level at which the switching transistor T2 is switched to the conducting state), and then the control signal ENABLE becomes active (voltage level at which the switching transistor T3 is switched to the conducting state), and the light-emission operation starts all together for the pixel circuits 20 of all of the rows. This eliminates the problem of unstable light-emission operation during the writing operation on the pixel circuits 20 of other rows. Accordingly, with the pixel circuit 20, it is possible to cause the organic EL element EL to emit light at a more accurate and stable luminance than in the conventional technique. Furthermore, it is no longer required to switch the power source voltage and the configuration of the power source circuit 6 can be further simplified.

Figure 18:
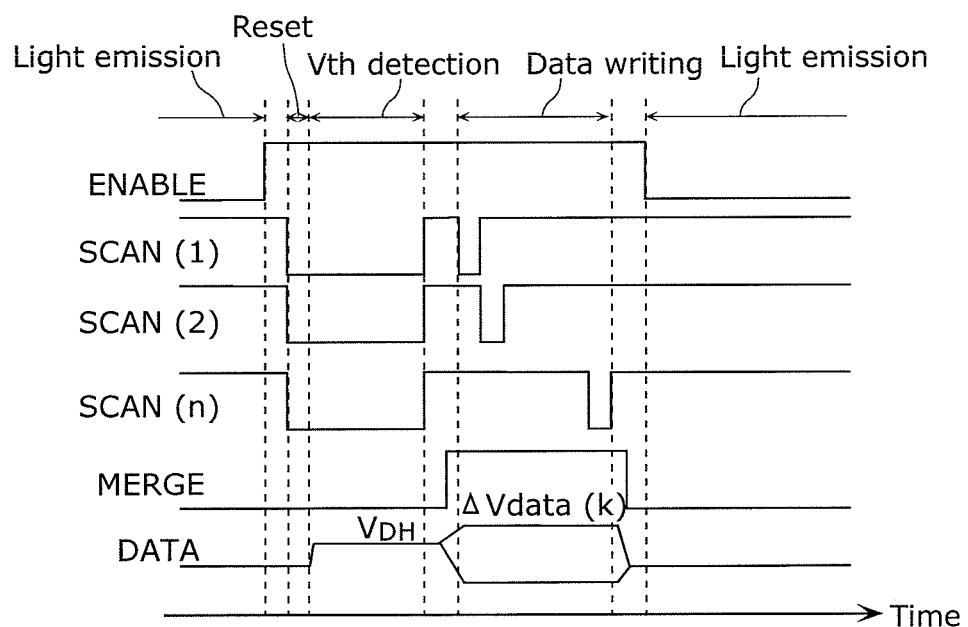
FIG. 18 is a timing chart showing another example of a control signal, power source voltage, and data signal according to Embodiment 6.

Moreover, causing the pixel circuit in FIG. 16 to operate according to the timing chart in FIG. 18 is an option. The reference voltage Vref may be lower than a voltage obtained by adding the power source voltage VSS and the light-emission start voltage (Vth (EL)) of the organic EL element EL. This timing chart makes it possible to reset the voltage of the connecting point of the capacitors C1 and C2, i.e. the voltage of the source electrode s of the drive transistor TD, to VSS+ Vth (EL) without causing a through-current to the organic EL element EL at a time of resetting. This improves the display contrast as compared to that in the conventional technique.

The above has described a display device and a control method thereof, particularly a characteristic pixel circuit used in the display device and the operation thereof, according to the present invention, with reference to some embodiments and modifications. However, the present invention is not limited to the embodiments and modifications. Display devices and the control methods thereof realized by various modifications apparent to those skilled in the art are applied and by a combination of constituent elements and operations in the embodiments and modifications are included within the scope of the present invention.

Figure 19:
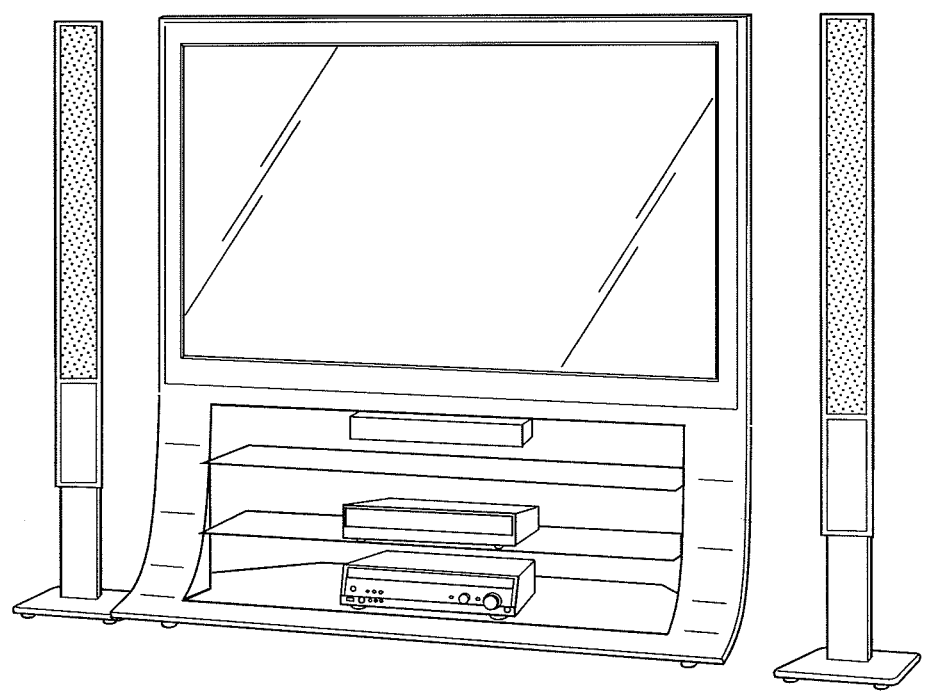
FIG. 19 is an external appearance showing an example of a thin flat TV having the display device according to the present invention.
Figure 20:
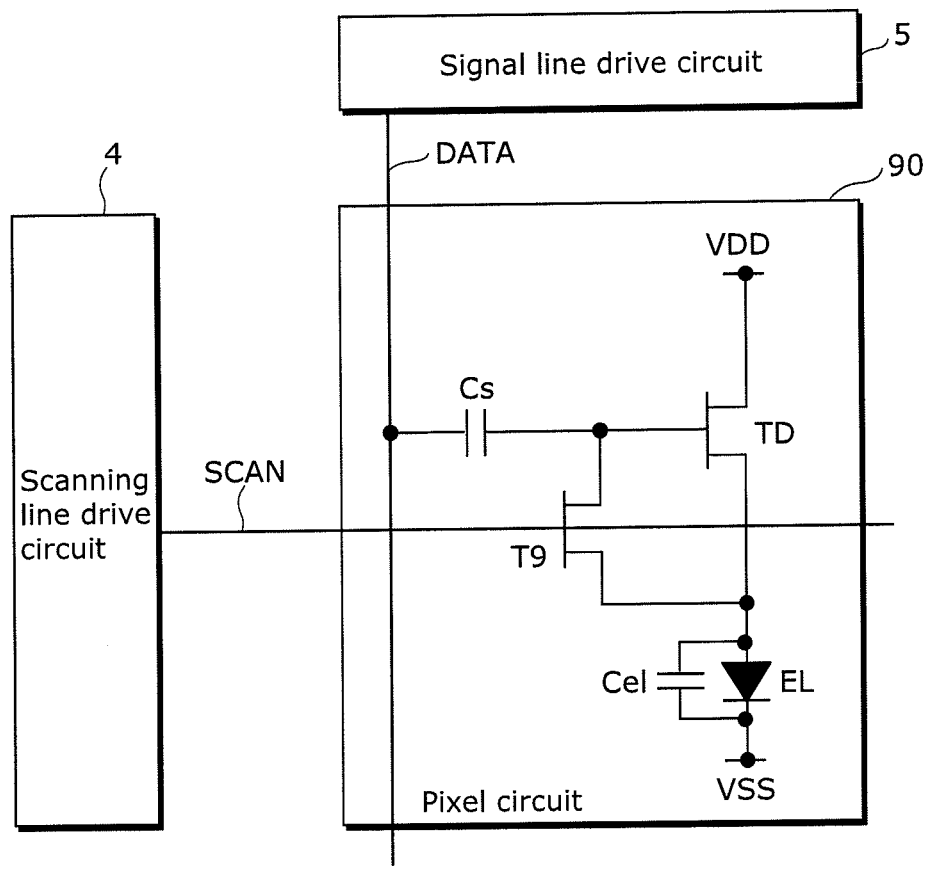
FIG. 20 is a circuit diagram showing an example of a configuration of a conventional pixel circuit.
Figure 21:
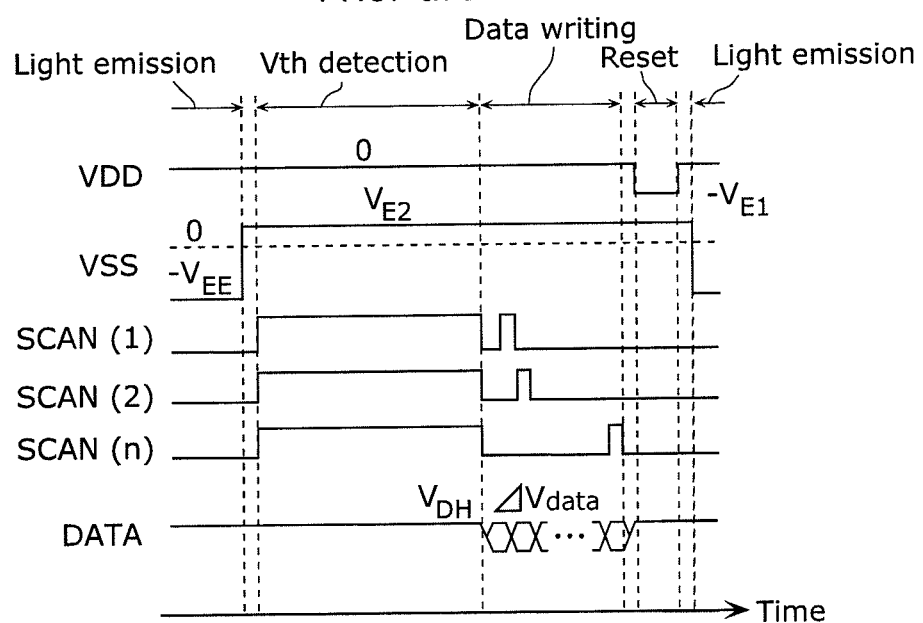
FIG. 21 is a timing chart showing an example of a conventional control signal, power source voltage, and data signal.
Figure 22:
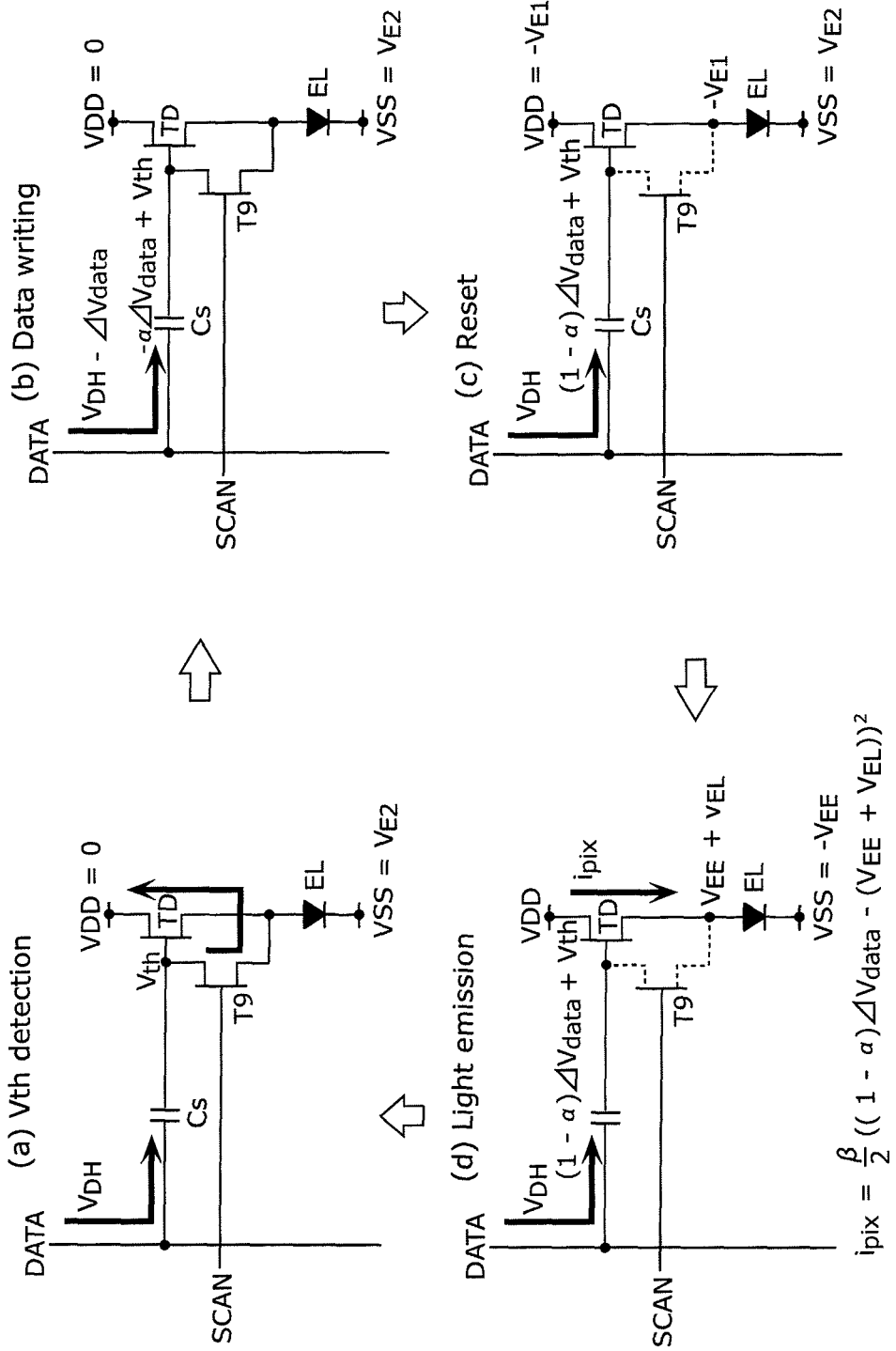
FIGS. 22(a)-(d) are circuit diagrams showing an example of the operation on the conventional pixel circuit.

The display device according to the present invention may be included in a thin flat TV as shown in FIG. 19. Having the display device according to the present invention realizes a thin flat TV capable of displaying images represented by video signals with high accuracy.

INDUSTRIAL APPLICABILITY

The present invention is useful in display devices using organic EL elements, and is particularly useful in an active-matrix organic EL display device.

REFERENCE SIGNS LIST

1 Display device
2 Display unit
3 Control circuit
4 Scanning line drive circuit
5 Signal line drive circuit
6 Power source circuit
10, 11, 12, 13, 14, 20, 90 Pixel circuit
TD Drive transistor
T1, T2, T3, T4, T9 Switching transistor
C1, C2, Cs Capacitor
EL Organic EL element

The invention claimed is:
1. A display device, comprising:
a display having a plurality of pixels, each of the pixels including:
a drive transistor having a drain electrode and a source electrode, one of the drain electrode and the source electrode being directly connected to a first power source line that transmits a first power source voltage;
a first capacitor having a first electrode directly connected to a gate electrode of the drive transistor and a second electrode directly connected to the source electrode of the drive transistor;
a second capacitor having a first electrode directly connected to the second electrode of the first capacitor and a second electrode directly connected to a data line that transmits a data voltage corresponding to a luminance;
a first switch that switches between conduction and non-conduction between the gate electrode of the drive transistor and a reference voltage line that transmits a fixed reference voltage; and
a light-emitting device having a first electrode directly connected to an other of the drain electrode and the source electrode of the drive transistor and a second electrode directly connected to a second power source line that transmits a second power source voltage,
wherein, in a data voltage writing period, the first switch is switched to a conducting state in a row-to-be-written and to a non-conducting state in a row other than the row-to-be-written.

2. The display device according to claim 1,
wherein each of the pixels further includes a second switch provided between the source electrode of the drive transistor and the second electrode of the first capacitor.

3. The display device according to claim 1,
wherein each of the pixels further includes a third switch provided between the first power source line and the one of the drain electrode and the source electrode of the drive transistor.

4. The display device according to claim 1,
wherein each of the pixels further includes a fourth switch provided between the data line and the second electrode of the second capacitor.

5. A method of controlling a display device including a display having a plurality of pixels, each of the pixels including:
a drive transistor having a drain electrode and a source electrode, one of the drain electrode and the source electrode being directly connected to a first power source line that transmits a first power source voltage;
a first capacitor having a first electrode directly connected to a gate electrode of the drive transistor and a second electrode directly connected to the source electrode of the drive transistor;
a second capacitor having a first electrode directly connected to the second electrode of the first capacitor and a second electrode directly connected to a data line that transmits a data voltage corresponding to a luminance;
a first switch that switches between conduction and non-conduction between the gate electrode of the drive transistor and a reference voltage line that transmits a fixed reference voltage; and
a light-emitting device having a first electrode directly connected to the other of the drain electrode and the source electrode of the drive transistor and a second electrode directly connected to a second power source line that transmits a second power source voltage, the method comprising:

detecting a threshold voltage of the drive transistor by switching the first switch conductive in each of the pixels; and writing a data voltage including switching the first switch to a conducting state in a row-to-be-written and to a non-conducting state in a row other than the row-to-be-written.

6. The method of controlling a display device according to claim 5, wherein, in at least the detecting, a voltage set to a value between a maximum value and a minimum value of the data voltage is applied to the second electrode of the second capacitor.

7. The method of controlling the display device according to claim 5, wherein, in the display device, each of the pixels further includes a second switch provided between the source electrode of the drive transistor and the second electrode of the first capacitor, and the writing includes switching the second switch to the non-conducting state, and holding the data voltage by the first capacitor and the second capacitor.

* * * * *